(12) United States Patent
Chang et al.

(10) Patent No.: US 11,939,212 B2
(45) Date of Patent: Mar. 26, 2024

(54) MEMS DEVICE, MANUFACTURING METHOD OF THE SAME, AND INTEGRATED MEMS MODULE USING THE SAME

(71) Applicant: Industrial Technology Research Institute, Hsinchu (TW)

(72) Inventors: Heng-Chung Chang, Taichung (TW); Jhih-Jie Huang, Hsinchu County (TW); Chih-Ya Tsai, Taichung (TW); Jing-Yuan Lin, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 450 days.

(21) Appl. No.: 17/412,160

(22) Filed: Aug. 25, 2021

(65) Prior Publication Data

US 2021/0380404 A1    Dec. 9, 2021

Related U.S. Application Data

(63) Continuation-in-part of application No. 16/726,025, filed on Dec. 23, 2019, now Pat. No. 11,365,117.

(30) Foreign Application Priority Data

Dec. 23, 2020   (TW) .................................. 109145665

(51) Int. Cl.
*B81C 1/00*   (2006.01)

(52) U.S. Cl.
CPC ...... *B81C 1/00015* (2013.01); *B81C 1/00476* (2013.01); *B81C 1/00531* (2013.01);
(Continued)

(58) Field of Classification Search
CPC ........ B81C 1/00158; B81C 2201/0105; B81C 2201/0198; B81C 2203/0172;
(Continued)

(56) References Cited

U.S. PATENT DOCUMENTS

| 5,567,650 A | 10/1996 | Straight et al. |
| 5,933,756 A | 8/1999 | Fuse |

(Continued)

FOREIGN PATENT DOCUMENTS

| CN | 101661012 A | 3/2010 |
| CN | 102951595 A | 3/2013 |

(Continued)

OTHER PUBLICATIONS

China Patent Office, Office Action, Patent Application Serial No. 202011535133.0, dated Aug. 11, 2023, Taiwan.

(Continued)

*Primary Examiner* — Moazzam Hossain

(57) ABSTRACT

A MEMS device is provided. The MEMS device includes a substrate having at least one contact, a first dielectric layer disposed on the substrate, at least one metal layer disposed on the first dielectric layer, a second dielectric layer disposed on the first dielectric layer and the metal layer and having a recess structure, and a structure layer disposed on the second dielectric layer and having an opening. The opening is disposed on and corresponds to the recess structure, and the cross-sectional area at the bottom of the opening is smaller than the cross-sectional area at the top of the recess structure. The MEMS device also includes a sealing layer, and at least a portion of the sealing layer is disposed in the opening and the recess structure. The second dielectric layer, the structure layer, and the sealing layer define a chamber.

15 Claims, 29 Drawing Sheets

(52) U.S. Cl.
CPC .. *B81C 1/00539* (2013.01); *B81C 2201/0105* (2013.01); *B81C 2201/0198* (2013.01); *B81C 2203/0172* (2013.01)

(58) Field of Classification Search
CPC .... B81C 2201/0108; B81C 2201/0109; B81B 2201/0264
See application file for complete search history.

(56) References Cited

U.S. PATENT DOCUMENTS

| | | |
|---|---|---|
| 6,407,002 B1 | 6/2002 | Lin et al. |
| 6,541,864 B1 | 4/2003 | Fukuzumi |
| 6,875,681 B1 | 4/2005 | Bohr |
| 6,982,475 B1 | 1/2006 | MacIntyre |
| 7,084,028 B2 | 8/2006 | Fukuzumi |
| 7,176,111 B2 | 2/2007 | Baert et al. |
| 7,205,181 B1 | 4/2007 | MacIntyre |
| 7,235,281 B2 | 6/2007 | Rusu et al. |
| 7,585,744 B2 | 9/2009 | Gogoi et al. |
| 7,803,665 B2 | 9/2010 | Witvrouw et al. |
| 8,062,497 B2 | 11/2011 | Witvrouw et al. |
| 8,487,386 B2 | 7/2013 | Jain et al. |
| 8,847,400 B2 | 9/2014 | Fujita et al. |
| 8,921,144 B2 | 12/2014 | Dunbar, III et al. |
| 8,921,997 B2 | 12/2014 | Shimooka et al. |
| 9,136,220 B2 | 9/2015 | Uchiyama |
| 9,428,377 B2 | 8/2016 | Quevy et al. |
| 9,443,790 B2 | 9/2016 | Fujita |
| 9,567,204 B2 | 2/2017 | Hung et al. |
| 9,567,207 B2 | 2/2017 | Tseng et al. |
| 9,567,208 B1* | 2/2017 | Cheng ................. B81B 3/0005 |
| 9,576,904 B2 | 2/2017 | Sandhu et al. |
| 9,704,798 B2 | 7/2017 | Govindaraju et al. |
| 10,043,824 B2 | 8/2018 | Lee et al. |
| 2006/0283272 A1 | 12/2006 | Grange et al. |
| 2007/0170528 A1 | 7/2007 | Tanaka et al. |
| 2009/0140146 A1 | 6/2009 | Sogawa et al. |
| 2009/0275163 A1 | 11/2009 | Lacey et al. |
| 2012/0199886 A1 | 8/2012 | Horak et al. |
| 2012/0256308 A1 | 10/2012 | Helin |
| 2014/0070339 A1 | 3/2014 | Marx et al. |
| 2014/0145302 A1 | 5/2014 | Hong |
| 2015/0061046 A1 | 3/2015 | Chang et al. |
| 2015/0102390 A1 | 4/2015 | Liu et al. |
| 2015/0298170 A1* | 10/2015 | Rothberg ............... B06B 1/0292 257/416 |
| 2015/0325538 A1 | 11/2015 | Asaoka et al. |
| 2016/0130137 A1 | 5/2016 | Huang et al. |
| 2016/0155664 A1 | 6/2016 | Chan et al. |
| 2016/0347609 A1 | 12/2016 | Yu et al. |
| 2017/0267518 A1 | 9/2017 | Kinugawa et al. |
| 2018/0175063 A1 | 6/2018 | Lee et al. |
| 2020/0035641 A1* | 1/2020 | Fountain, Jr. ........... H01L 25/18 |

FOREIGN PATENT DOCUMENTS

| | | |
|---|---|---|
| CN | 102963856 A | 3/2013 |
| CN | 202808341 U | 3/2013 |
| CN | 109841580 A | 6/2014 |
| CN | 103922273 A | 7/2014 |
| CN | 109326554 A | 2/2019 |
| CN | 109626318 A | 4/2019 |
| CN | 109738109 A | 5/2019 |
| CN | 113086939 A | 7/2021 |
| DE | 102013206368 A1 | 10/2014 |
| EP | 2236456 A1 | 10/2010 |
| TW | 511242 B | 11/2002 |
| TW | 201135867 A | 10/2011 |
| TW | 201641415 A | 12/2016 |
| TW | 201736242 A | 10/2017 |
| TW | 201743371 A | 12/2017 |
| TW | 201925079 A | 7/2019 |

OTHER PUBLICATIONS

China Patent Office, Office Action, Patent Application Serial No. 201911409076.9, dated Aug. 31, 2023, Taiwan.

Liu, Chang and Yu-Chong Tai. "Sealing of Micromachined Cavities Using Chemical Vapor Deposition Methods Characterization and Optimization" IEEE Journal of Microelectrome Chanical Systems, Jun. 1999, pp. 135-145, vol. 8, No. 2, 1999, IEEE, US.

Candler, Rob N. "Encapsulation by Film Deposition," Handbook of Silicon Based MEMS Materials and Technologies, 2009, pp. 569-574, US.

Sharma, Jaibir, et al. "Preparation of porous metal membrane by thermal annealing for thin film encapsulation," International Journal of Materials and Metallurgical Engineering, 2015, pp. 1092-1095, vol. 9, No. 9, US.

* cited by examiner

MEMS DEVICE, MANUFACTURING METHOD OF THE SAME, AND INTEGRATED MEMS MODULE USING THE SAME

CROSS REFERENCE TO RELATED APPLICATIONS

This application is a Continuation-In-Part of pending U.S. patent application Ser. No. 16/726,025, filed Dec. 23, 2019 and entitled "MEMS DEVICE AND MANUFACTURING METHOD OF THE SAME," and claims the benefit of Taiwan Application No. 109145665, filed Dec. 23, 2020, the entirety of which is incorporated by reference herein

TECHNICAL FIELD

Embodiments of the present disclosure relate to a microelectromechanical system (MEMS) device, a manufacturing method of the same, and an integrated MEMS module using the same, and in particular they relate to a MEMS device with good sealing quality, a manufacturing method of the same, and an integrated MEMS module using the same.

BACKGROUND

Microelectromechanical system (MEMS) devices typically include mechanical components (e.g., fixed and/or movable components) to sense a physical condition (e.g., force, acceleration, pressure, temperature, or vibration) and electronic components to process electrical signals. Therefore, MEMS devices are often used as sensors and are widely used in applications such as automotive systems, inertial guidance systems, home appliances, protection systems for various devices, and many other industrial, scientific, and engineering systems.

Existing MEMS devices generally meet requirements, but they are not satisfactory in every respect. For example, when a MEMS device is used as a pressure sensor, it may be necessary to provide a sealed (air-tight) chamber, thus requiring good sealing quality. However, in order to achieve this, manufacturing problems may arise, including long processing times and complicated manufacturing processes.

SUMMARY

In some embodiments of the present disclosure, by providing a recess structure in the dielectric layer and an opening corresponding to the recess structure in the structure layer, a sealing layer (i.e., a structure for sealing holes) may be continuously and uniformly filled into the opening and the recess structure to complete sealing. The MEMS device and the manufacturing method thereof according to the embodiments of the present disclosure may effectively prevent the generation of sealing seams and hollow structures, thereby improving sealing quality and overall stability. In addition, no complicated process is required, which may effectively shorten the process time and reduce costs.

The embodiments of the present disclosure provide a MEMS device. The MEMS device includes a substrate having at least one contact. The MEMS device also includes a first dielectric layer disposed on the substrate. The MEMS device further includes at least one metal layer disposed on the first dielectric layer, and at least a portion of the metal layer electrically connected to the contact. The MEMS device includes a second dielectric layer disposed on the first dielectric layer and the metal layer and having a recess structure. The MEMS device also includes a structure layer disposed on the second dielectric layer and having an opening. The opening is disposed on and corresponds to the recess structure, and the cross-sectional area at the bottom of the opening is smaller than the cross-sectional area at the top of the recess structure. The MEMS device further includes a sealing layer, and at least a portion of the sealing layer is disposed in the opening and the recess structure. The second dielectric layer, the structure layer, and the sealing layer define a chamber.

The embodiments of the present disclosure provide a manufacturing method of a MEMS device. The manufacturing method of the MEMS device includes providing a substrate having at least one contact. The manufacturing method of the MEMS device also includes forming a first dielectric layer on the substrate. The first dielectric layer has at least one through hole exposing a portion of a top surface of the contact. The manufacturing method of the MEMS device further includes forming at least one metal layer on the first dielectric layer. At least a portion of the metal layer is electrically connected to the contact. The manufacturing method of the MEMS device includes forming a second dielectric layer on the first dielectric layer and the metal layer. The second dielectric layer has a recess structure. The manufacturing method of the MEMS device also includes forming a sacrificial layer on the second dielectric layer and in the recess structure. The manufacturing method of the MEMS device further includes forming a structure layer on the second dielectric layer and the sacrificial layer. The manufacturing method of the MEMS device includes removing a portion of the structure layer to form an opening. The opening exposes the sacrificial layer in the recess structure. The manufacturing method of the MEMS device also includes removing the sacrificial layer to expose the recess structure. The cross-sectional area at the bottom of the opening is smaller than the cross-sectional area at the top of the recess structure. The manufacturing method of the MEMS device further includes forming a sealing layer. At least a portion of the sealing layer is formed in the opening and the recess structure, and the second dielectric layer, the structure layer, and the sealing layer define a chamber.

The embodiments of the present disclosure provide a manufacturing method of a MEMS device. The manufacturing method of the MEMS device includes providing a substrate having at least one contact. The manufacturing method of the MEMS device also includes forming a first dielectric layer on the substrate. The first dielectric layer has at least one through hole that exposes a portion of a top surface of the contact. The manufacturing method of the MEMS device further includes forming at least one first metal layer on the first dielectric layer. At least a portion of the first metal layer is electrically connected to the contact. Moreover, the manufacturing method of the MEMS device includes forming a second dielectric layer on the first dielectric layer and the first metal layer. The manufacturing method of the MEMS device also includes forming a sacrificial layer on the second dielectric layer. The manufacturing method of the MEMS device further includes forming a structure layer on the second dielectric layer and the sacrificial layer. Furthermore, the manufacturing method of the MEMS device includes removing a portion of the structure layer to form a first opening. The first opening exposes a portion of the top surface of the sacrificial layer. The manufacturing method of the MEMS device also includes removing a portion of the sacrificial layer through the first opening to form a second opening. The second opening exposes a portion of the top surface of the second dielectric layer. The manufacturing method of the MEMS device further includes removing a portion of the second dielectric layer through the second opening to form a recess structure. The cross-sectional area at the bottom of the first opening is smaller than the cross-sectional area at the top of the recess structure. In addition, the manufacturing method of the MEMS device includes removing the sacrificial layer. The manufacturing method of the MEMS device also includes forming a sealing layer. At least a portion of the sealing layer is formed in the second opening and the recess structure. In addition, the second dielectric layer, the structure layer, and the sealing layer define a chamber.

The embodiments of the present disclosure provide an integrated MEMS module. The integrated MEMS module includes a plurality of the aforementioned MEMS devices. The MEMS devices form on the substrate.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
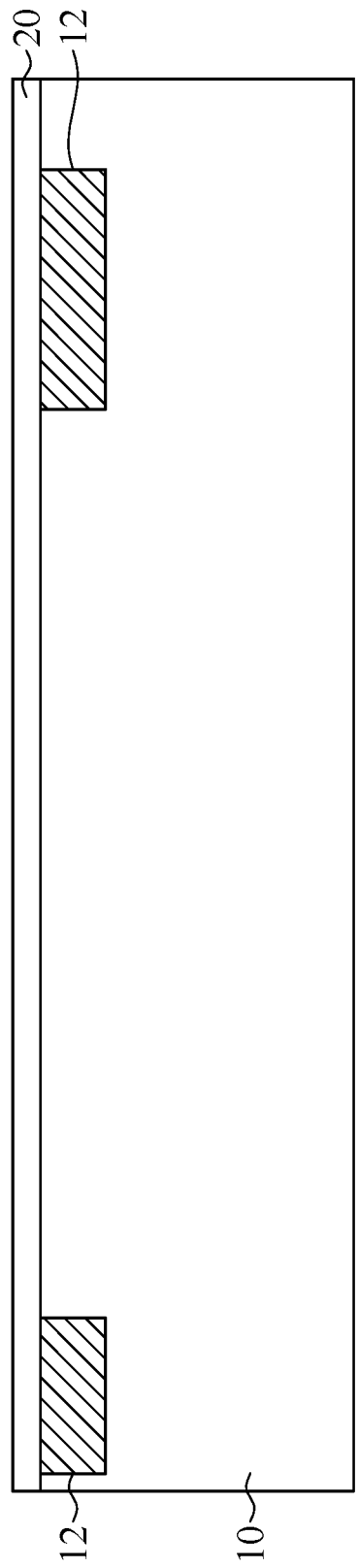
FIG. 1 is a cross-sectional view illustrating the MEMS device at one stage of manufacture according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional operations can be provided before, during, and after the method, and some of the operations described can be replaced or eliminated for other embodiments of the method.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood through one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Different embodiments disclosed below may repeat reference numerals and/or letters in the various examples. This repetition is for the purpose of simplicity and clarity and does not in itself dictate a relationship between the various embodiments and/or configurations discussed.

FIG. 1 to FIG. 8 are a series of cross-sectional views illustrating various stages of a method for manufacturing the MEMS device 100 according to some embodiments of the present disclosure. It should be noted that, in order to more clearly show the features of the embodiments of the present disclosure, some components may be omitted in FIG. 1 to FIG. 8.

Referring to FIG. 1, firstly, a substrate 10 is provided. The substrate 10 may have at least one contact 12. In some embodiments, the substrate 10 may include silicon, but the present disclosure is not limited thereto. For example, in some other embodiments, the substrate 10 may include other elementary semiconductors (e.g., germanium). The substrate 10 may also include compound semiconductors (e.g., silicon carbide (SiC), gallium arsenic (GaAs), indium arsenide (InAs), or indium phosphide (InP)). The substrate 10 may further include alloy semiconductors (e.g., silicon germanium (SiGe), silicon germanium carbide (SiGeC), gallium arsenic phosphide (GaAsP), or gallium indium phosphide (GaInP)).

In some embodiments, the substrate 10 may include semiconductor-on-insulator (SOI), such as silicon-on-insulator or germanium-on-insulator. The semiconductor-on-insulator substrate may include a bottom substrate, a buried oxide layer disposed on the bottom substrate, and a semiconductor layer disposed on the buried oxide layer. In some embodiments, the substrate 10 may include single-crystal substrate, multi-layer substrate, any other applicable substrate, or a combination thereof, but the present disclosure is not limited thereto.

In some embodiments, the substrate 10 may include P-type dopants (e.g. boron, aluminum, gallium, indium, or thallium) or N-type dopant (e.g. arsenic, phosphorus, or antimony). The dopants may form a doped region in the substrate 10, and the doped region may, for example, form a part of the contact 12, but the present disclosure is not limited thereto. In some embodiments, the substrate 10 may be regarded as a chip of the MEMS device 100.

Referring to FIG. 1, then, a first dielectric layer 20 is formed on the substrate 10. In some embodiments, the material of the first dielectric layer 20 may include, for example, an oxide (e.g., silicon oxide), a nitride (e.g., silicon nitride), any other applicable material, or a combination thereof, but the present disclosure is not limited thereto. In some embodiments, the first dielectric layer 20 may be deposited on the substrate 10 through a deposition process. The deposition process may include metal organic chemical vapor phase deposition (MOCVD), atomic layer deposition (ALD), molecular beam epitaxy (MBE), liquid phase epitaxy (LPE), similar processes, or a combination thereof, but the present disclosure is not limited thereto.

Figure 2:
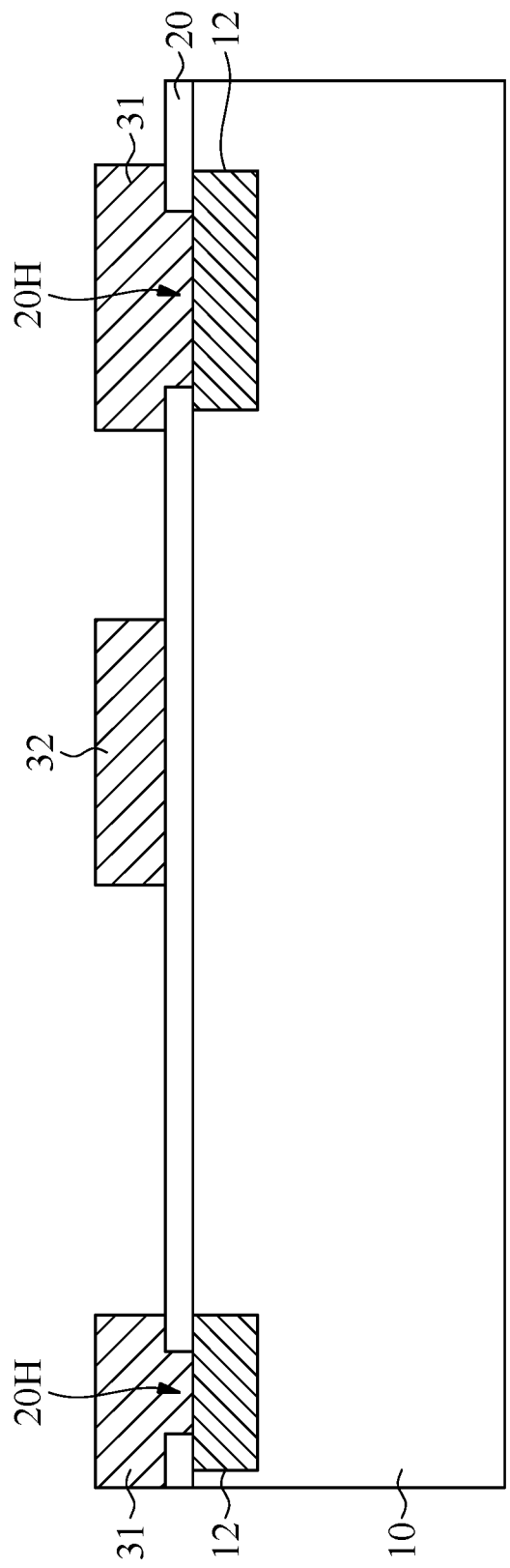
FIG. 2 is a cross-sectional view illustrating the MEMS device at one stage of manufacture according to some embodiments of the present disclosure.

Referring to FIG. 2, at least one through hole 20H is formed in the first dielectric layer 20. The through hole 20H may be disposed on and correspond to the contact 12 and expose a portion of the top surface of the contact 12. A patterning process may be performed on the first dielectric layer 20 to form the through hole 20H. For example, a mask layer (not shown) may be provided on the first dielectric layer 20, and then the mask layer is used as an etching mask to perform an etching process to form the through hole 20H on the first dielectric layer 20. In some embodiments, the mask layer may include a photoresist, such as a positive photoresist or a negative photoresist. The mask layer may be a single-layer structure or a multi-layer structure. The formation of the mask layer may include a deposition process, a photolithography process, any other applicable process, or a combination thereof, but the present disclosure is not limited thereto.

In some embodiments, the deposition process may include spin-on coating, chemical vapor phase deposition (CVD), atomic layer deposition (ALD), similar processes, or a combination thereof. In some embodiments, the photolithography process may include photoresist coating (e.g., spin coating), soft baking, mask aligning, exposure, post-exposure baking (PEB), developing, rinsing, drying (e.g., hard baking), any other applicable process, or a combination thereof, but the present disclosure is not limited thereto.

In some embodiments, the etching process may include a dry etching process, a wet etching process, or a combination thereof. For example, the dry etching process may include a reactive ion etching (RIE), an inductively-coupled plasma (ICP) etching, a neutral beam etching (NBE), an electron cyclotron resonance (ECR) etching, similar processes, or a combination thereof, but the present disclosure is not limited thereto.

Referring to FIG. 2, then, a first metal layer 30 is formed on the first dielectric layer 20, wherein at least a portion of the first metal layer 30 is electrically connected to the contact 12. In particular, as shown in FIG. 2, the first metal layer 30 may include a first portion 31 and a second portion 32. The first portion 31 may be in direct contact with the contact 12 through the through hole 20H of the first dielectric layer 20, and the second portion 32 may be separated from the contact 12 by the first dielectric layer 20. That is, the first portion 31 of the first metal layer 30 may be electrically connected to the contact 12, and the second portion 32 of the first metal layer 30 may be electrically isolated from the contact 12, but the present disclosure is not limited thereto. For example, the first portion 31 of the first metal layer 30 may be used to electrically connect the contact 12 to a subsequent structure.

In some embodiments, the material of the first metal layer 30 may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto. In some embodiments, the metal material may be formed on the first dielectric layer 20 by physical vapor deposition (PVD), chemical vapor phase deposition (CVD), atomic layer deposition (ALD), evaporation, sputtering, similar processes, or a combination thereof, but the present disclosure is not limited thereto. Then, a patterning process may be performed on the metal material to form the first portion 31 and the second portion 32 of the first metal layer 30. The example of the patterning process is as described above, so it will not be repeated here.

Figure 3:
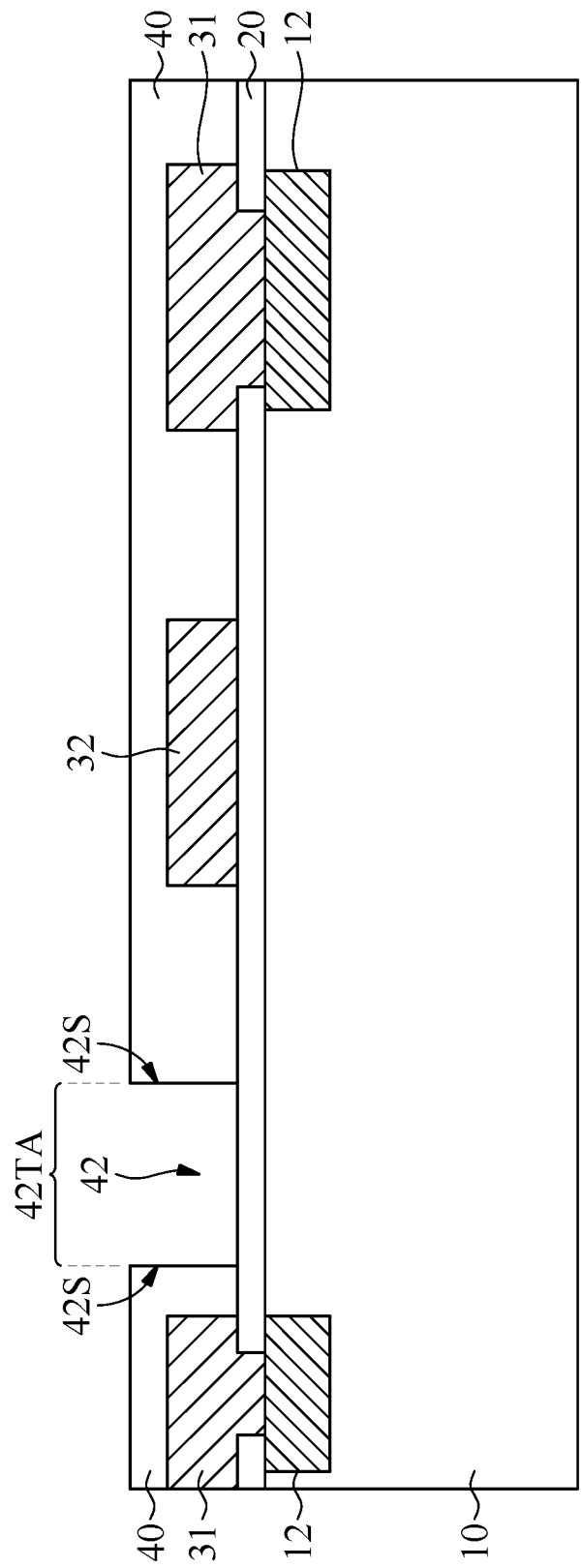
FIG. 3 is a cross-sectional view illustrating the MEMS device at one stage of manufacture according to some embodiments of the present disclosure.

Referring to FIG. 3, a second dielectric layer 40 is formed on the first dielectric layer 20 and the first metal layer 30, and the second dielectric layer 40 has a recess structure 42. Similarly, the material of the second dielectric layer 40 may include, for example, an oxide (e.g., silicon oxide), a nitride (e.g., silicon nitride), any other applicable material, or a combination thereof, but the present disclosure is not limited thereto. In some embodiments, the material of the second dielectric layer 40 may be the same as or different from the material of the first dielectric layer 20, which may be determined based on actual demands. In some embodiments, the second dielectric layer 40 may be deposited on the first dielectric layer 20 and the first metal layer 30 through a deposition process. The example of the deposition process is as described above, so it will not be repeated here. In addition, a patterning process may be performed on the second dielectric layer 40 to form the recess structure 42. For example, a mask layer (not shown) may be disposed on the second dielectric layer 40, and then the mask layer may be used as an etching mask to perform an etching process to form the recess structure 42. In some embodiments, the etching process may include a dry etching process, a wet etching process, or a combination thereof.

As shown in FIG. 3, in some embodiments, the recess structure 42 of the second dielectric layer 40 may expose a portion of the top surface of the first dielectric layer 20, but the present disclosure is not limited thereto. In some embodiments, the recess structure 42 may also be disposed over the first dielectric layer 20 and not expose the first dielectric layer 20; alternatively, the recess structure 42 may also expose a portion of the top surface of the second portion 32 of the first metal layer 30, which may be determined based on actual demands.

In some embodiments, the sidewall 42S of the recess structure 42 may be substantially perpendicular to the top surfaces of the first dielectric layer 20 and the second dielectric layer 40, but the present disclosure is not limited thereto. In the embodiment shown in FIG. 3, the recess structure 42 may have a constant cross-sectional area. That is, the cross-sectional area of the recess structure 42 at different depths may be substantially the same as the cross-sectional area 42TA at the top of the recess structure 42, but the present disclosure is not limited thereto.

Figure 4:
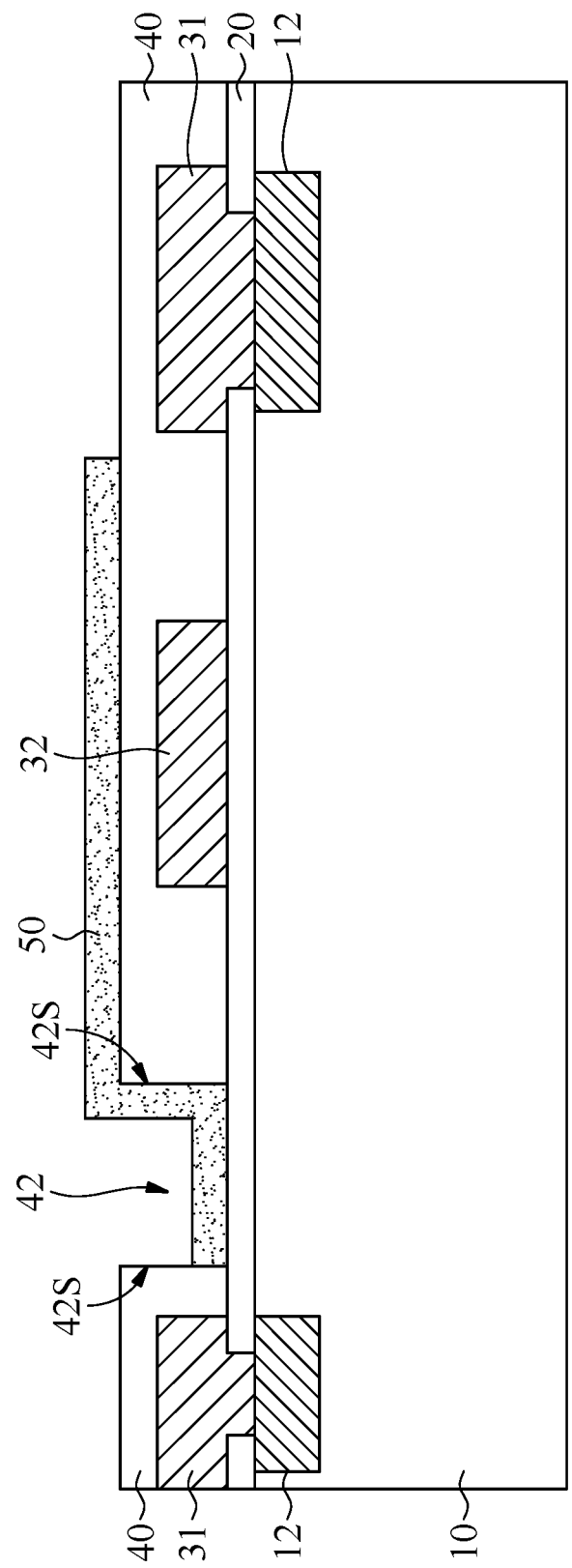
FIG. 4 is a cross-sectional view illustrating the MEMS device at one stage of manufacture according to some embodiments of the present disclosure.

Referring to FIG. 4, a sacrificial layer 50 is formed on the second dielectric layer 40 and in the recess structure 42. In particular, the sacrificial layer 50 may be formed on the bottom surface and a portion of the sidewall 42S of the recess structure 42 and a portion of the top surface of the second dielectric layer 40. In some embodiments, the material of the sacrificial layer 50 may include silicon oxide, photoresist, polyimide, germanium, any other applicable material, or a combination thereof, but the present disclosure is not limited thereto. In some embodiments, the sacrificial layer 50 may have a high etching selectivity comparing to the first dielectric layer 20, the first metal layer 30, and the second dielectric layer 40. Therefore, during the subsequent process of removing the sacrificial layer 50, the first dielectric layer 20, the first metal layer 30, and the second dielectric layer 40 may be prevented from being damaged. In some embodiments, the sacrificial layer 50 may be formed on the second dielectric layer 40 and in the recess structure 42 by a deposition process. The example of the deposition process is as described above, so it will not be repeated here.

Figure 5:
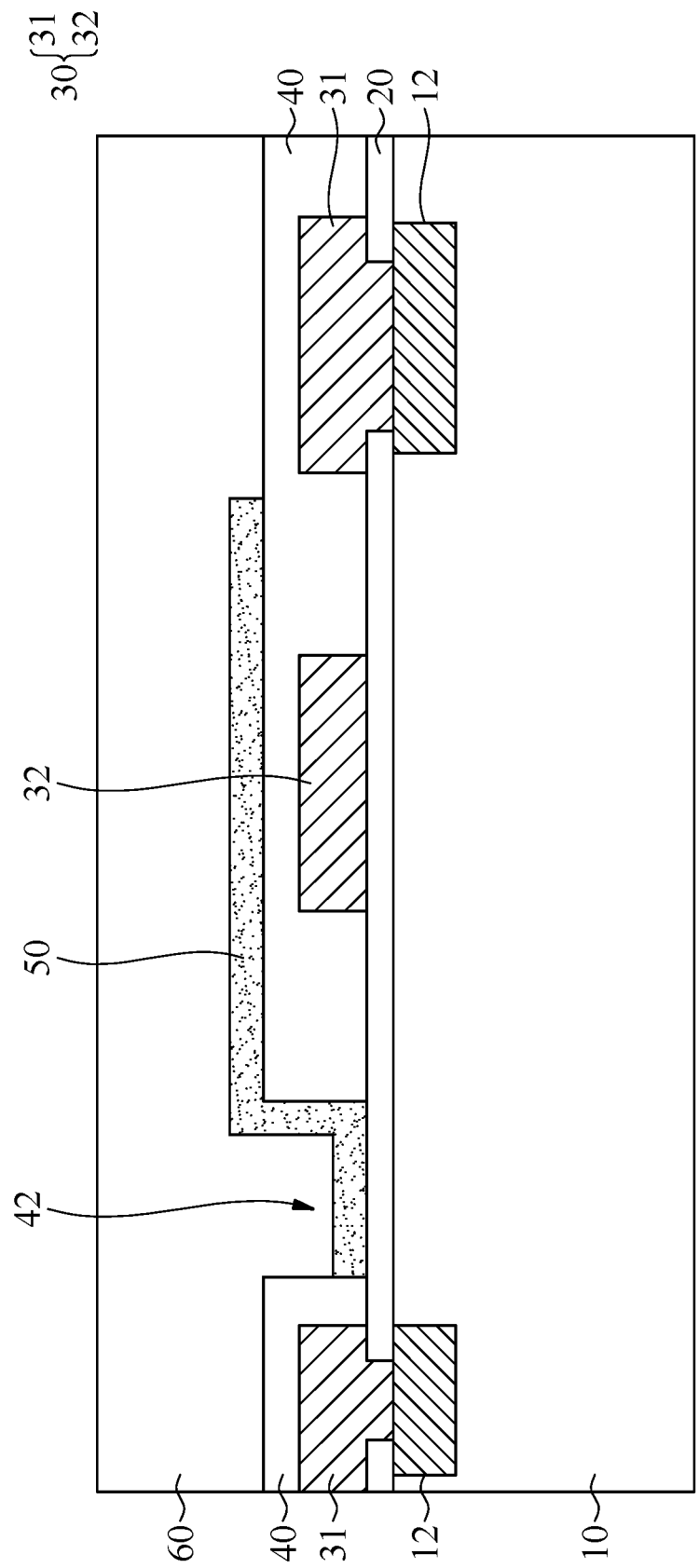
FIG. 5 is a cross-sectional view illustrating the MEMS device at one stage of manufacture according to some embodiments of the present disclosure.

Referring to FIG. 5, a structure layer 60 is formed on the second dielectric layer 40 and the sacrificial layer 50. In particular, the structure layer 60 may be formed on the top surface of the second dielectric layer 40 and the top surface of the sacrificial layer 50, and fills the remaining space of the recess structure 42. In some embodiments, the material of the structure layer 60 may include polycrystalline silicon, epitaxial silicon, silicon germanium, any other applicable semiconductor material, or a combination thereof, but the present disclosure is not limited thereto. In some embodiments, the sacrificial layer 50 may also have a high etching selectivity comparing to the structure layer 60. In some embodiments, the structure layer 60 may be formed on the second dielectric layer 40 and the sacrificial layer 50 and in the recess structure 42 by a deposition process. The example of the deposition process is as described above, so it will not be repeated here. In some embodiments, the structure layer 60 may be considered as a part of a MEMS substrate.

Figure 6:
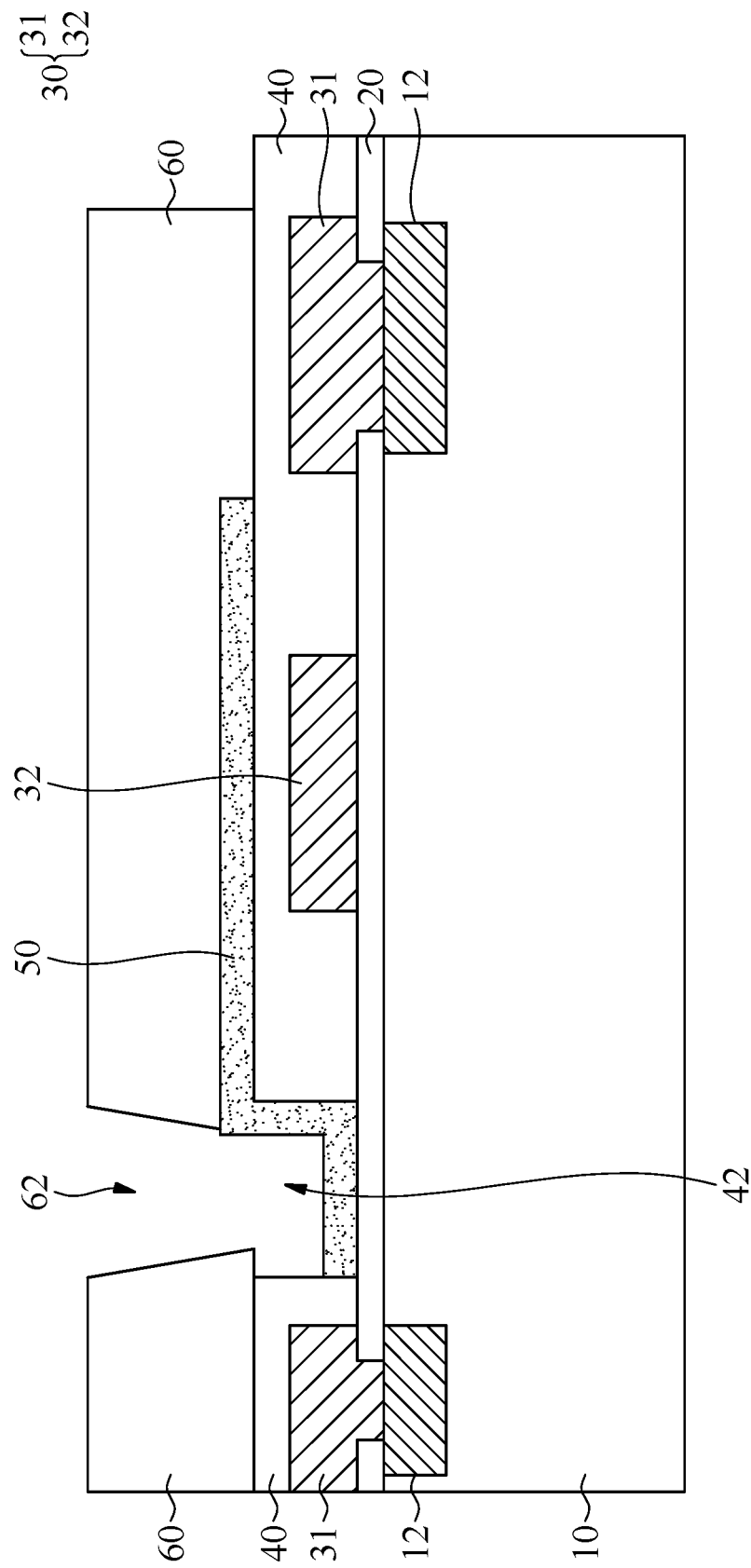
FIG. 6 is a cross-sectional view illustrating the MEMS device at one stage of manufacture according to some embodiments of the present disclosure.

Referring to FIG. 6, a portion of the structure layer 60 is removed to form an opening 62. In particular, the opening 62 corresponds to the recess structure 42 (i.e., the opening 62 is disposed over the recess structure 42), and the opening 62 may expose the sacrificial layer 50 in the recess structure 42. In some embodiments, a patterning process may be performed on the structure layer 60 to form the opening 62. For example, a mask layer (not shown) may be disposed on the structure layer 60, and then the mask layer may be used as an etching mask to perform a dry etching process to form the opening 62 in the structure layer 60. Here, the etching gas used in the dry etching process includes, for example, $CF_4$, $O_2$, $SF_6$, $C_4F_8$, Ar, $Cl_2$, $BCl_3$, any other applicable etching gases, or a combination thereof, but the present disclosure is not limited thereto.

Figure 7:
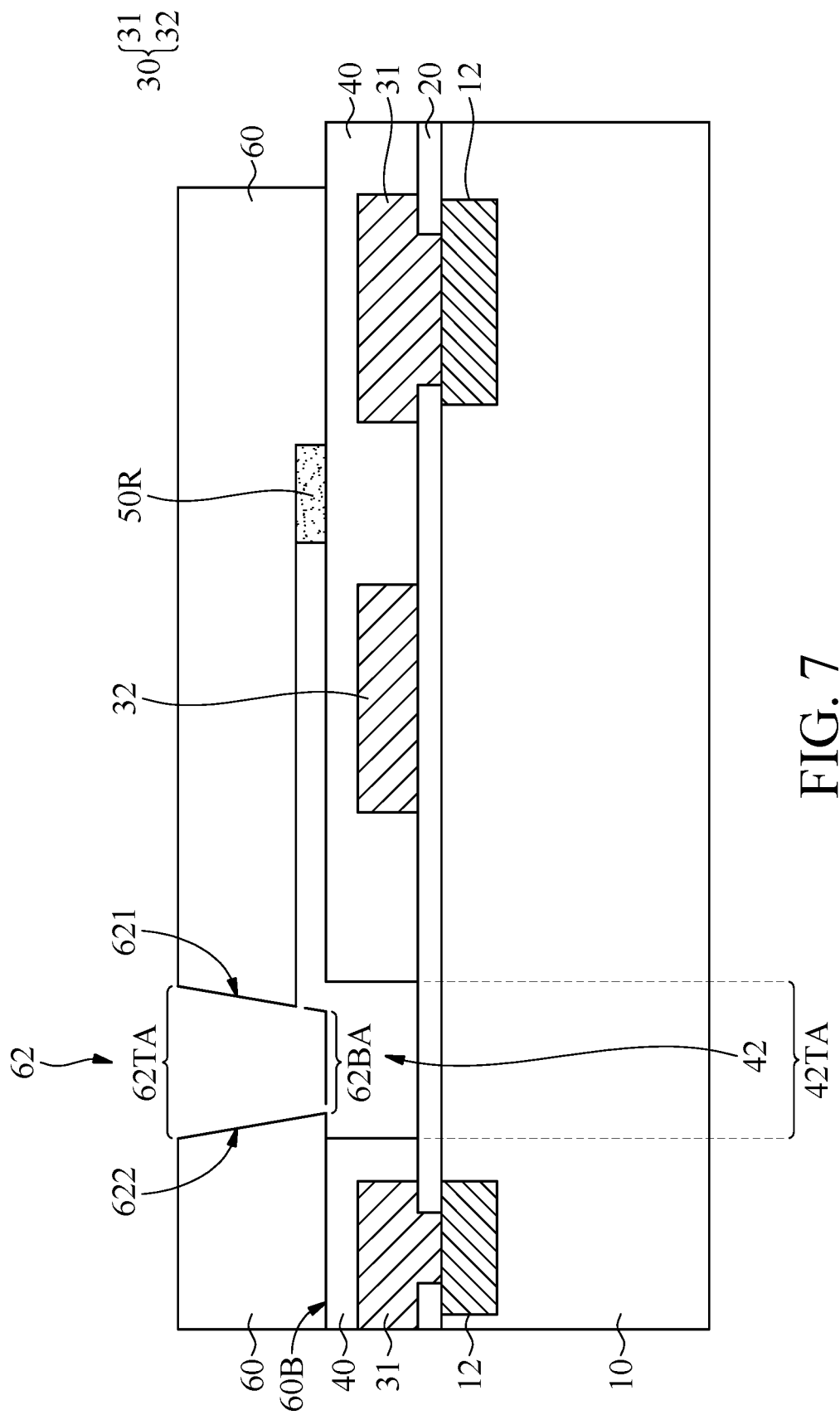
FIG. 7 is a cross-sectional view illustrating the MEMS device at one stage of manufacture according to some embodiments of the present disclosure.

Referring to FIG. 7, the sacrificial layer 50 is removed. In particular, the sacrificial layer 50 in the recess structure 42 and between the second dielectric layer 40 and the structure layer 60 is removed to expose the recess structure 42. For example, a wet etching process may be performed on the sacrificial layer 50 to remove the sacrificial layer 50. Here, the etching solution used in the wet etching process includes, for example, sulfuric acid ($H_2SO_4$), phosphoric acid ($H_3PO_4$), hydrofluoric acid (HF), hydrogen peroxide ($H_2O_2$), ammonia water ($NH_4OH$), etc., but the present disclosure is not limited thereto. Since the sacrificial layer 50 may have a high etching selectivity comparing to the first dielectric layer 20, the first metal layer 30, the second dielectric layer 40, and the structure layer 60, the first dielectric layer 20, the first metal layer 30, the second dielectric layer 40, and the structure layer 60 may be prevented from being damaged during the process of removing the sacrificial layer 50. In some embodiments, part of the sacrificial layer 50 may be retained. For example, as shown in FIG. 7, the retained sacrificial layer 50 may be regarded as a remaining portion of sacrificial layer 50R, and the remaining portion of sacrificial layer 50R is disposed between the second dielectric layer 40 and the structure layer 60, but the present disclosure is not limited thereto. In some other embodiments, the sacrificial layer 50 may be completely removed.

As shown in FIG. 7, in some embodiments, the cross-sectional area 62BA at the bottom of the opening 62 is smaller than the cross-sectional area 42TA at the top of the recess structure 42. Since the sacrificial layer 50 may occupy part of the space between the second dielectric layer 40 and the structure layer 60 in the foregoing steps, after the sacrificial layer 50 is removed, the bottommost of the sidewall 621 and the bottommost of the sidewall 622 of the opening 62 are not on the same plane. Here, the bottom surface 60B of the structure layer 60 is extended, and the sidewall 621 of the opening 62 is extended, and the cross-sectional area of the bottommost of the space formed by the two extension surfaces and the sidewall 622 of the opening 62 may be defined as the cross-sectional area 62BA at the bottom of the opening 62 (as shown in FIG. 7).

As shown in FIG. 7, in some embodiments, the cross-sectional area 62BA at the bottom of the opening 62 is smaller than the cross-sectional area 62TA at the top of the opening 62. In particular, the cross-sectional areas of the openings 62 at different depths are not constant and may be continuously changed. For example, as shown in FIG. 7, in cross-sectional areas of the openings 62 at this stage, the sidewall 621 and the sidewall 622 of the opening 62 may be presented as two incline surfaces, but the present disclosure is not limited thereto.

Figure 8:
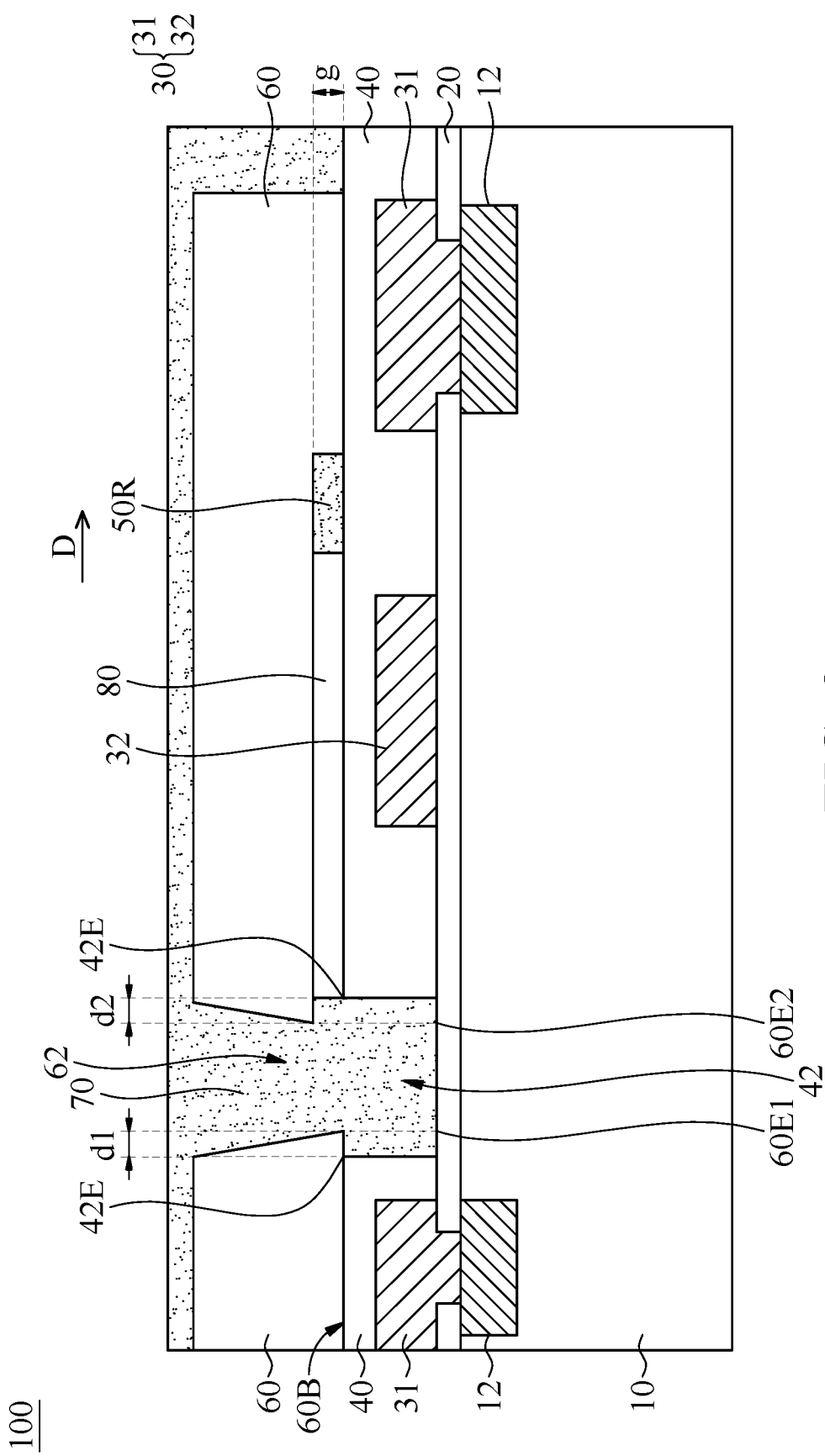
FIG. 8 is a cross-sectional view illustrating the MEMS device at one stage of manufacture according to some embodiments of the present disclosure.

Referring to FIG. 8, a sealing layer 70 is formed to form the MEMS device 100. In particular, at least a portion of the sealing layer 70 may be formed in the opening 62 and the recess structure 42. That is, the sealing layer 70 may be continuously formed and fill the space in which the opening 62 and the recess structure 42 are located, so that the second dielectric layer 40, the structure layer 60, and the sealing layer 70 may define a chamber 80. In other words, the chamber 80 may partially or completely replace the space occupied by the original sacrificial layer 50 between the second dielectric layer 40 and the structure layer 60. That is, the chamber 80 is between the second dielectric layer 40, the structure layer 60, and the sealing layer 70. In addition, as shown in FIG. 8, in some embodiments, the chamber 80 may be between the second dielectric layer 40, the remaining portion of sacrificial layer 50R, the structure layer 60, and the sealing layer 70. Therefore, the height g of the chamber 80 may be substantially equal to the thickness of the remaining portion of sacrificial layer 50R.

In some embodiments, the material of the sealing layer 70 may include silicon oxide, silicon nitride, photoresist, polyimide, any other applicable material, or a combination thereof, but the present disclosure is not limited thereto. In some embodiments, the sealing layer 70 may be formed in the opening 62 and the recess structure 42 by a deposition process. The example of the deposition process is as described above, so it will not be repeated here. Here, the sealing layer 70 may be regarded as the sealing structure of the MEMS device 100. In addition, as shown in FIG. 8, part of the sealing layer 70 may be formed on the structure layer 60, but the present disclosure is not limited thereto.

As shown in FIG. 8, in some embodiments, the recess structure 42 exposes a portion of the top surface of the first dielectric layer 20, so that the sealing layer 70 may be in direct contact with the first dielectric layer 20, but the present disclosure is not limited thereto. In some other embodiments, the recess structure 42 may be disposed over the first dielectric layer 20 and not expose the first dielectric layer 20, so that the sealing layer 70 may be in direct contact with the second dielectric layer 40.

In a general MEMS device that does not have a recess structure, since the formation (deposition) speed of the portion corresponding to the center of the opening 62 is greater than the formation (deposition) speed of the portion away from the center of the opening 62 during the process of forming (depositing) the sealing layer 70, it is easy to form a sealing seam. In contrast, since the MEMS device 100 in the embodiment of the present disclosure includes the recess structure 42 corresponding to the opening 62, it is possible to effectively prevent the generation of the sealing seam.

Moreover, in some embodiments of the present disclosure, since the cross-sectional area 62BA at the bottom of the opening 62 is smaller than the cross-sectional area 62TA at the top of the opening 62, the sealing layer 70 may be formed in the opening 62 more uniformly, thereby avoiding the hollow structure caused by the early closing of the recess structure 42 and the opening 62 before the sealing layer 70 has been filled.

Therefore, in the MEMS device 100 according to some embodiments of the present disclosure, by providing the recess structure 42 in the second dielectric layer 40 and the opening 62 corresponding to the recess structure 42 in the structure layer 60, the sealing layer 70 (i.e., a structure for sealing holes) may be continuously and uniformly filled into the opening 62 and the recess structure 42 to complete sealing. That is, the MEMS device 100 and the manufacturing method thereof according to the embodiments of the present disclosure may effectively prevent the generation of sealing seams and hollow structures, thereby improving sealing quality and enhancing overall stability of the MEMS device 100. In addition, no complicated process is required, which may effectively shorten the process time and reduce costs.

As shown in FIG. 8, in some embodiments, the projection of the structure layer 60 on the bottom surface of the recess structure 42 has an end portion 60E1 (or 60E2) corresponding to the opening 62, and the shortest distance d1 (or d2) between the end portion 60E1 (or 60E2) and the top 42E of the recess structure 42 in the direction D parallel with the top surface of the second dielectric layer 40 (or the bottom surface 60B of the structure layer 60) is larger than or equal to the thickness of the sacrificial layer 50 (or the thickness of the remaining portion of sacrificial layer 50R) (i.e., the height g of the chamber 80), but the present disclosure is not limited thereto. In the embodiments of the present disclosure, the shortest distance d1 (or d2) between the end portion 60E1 (or 60E2) and the top 42E of the recess structure 42 in the direction D parallel with the top surface of the second dielectric layer 40 (or the bottom surface 60B of the structure layer 60) may be adjusted according to the depth of the recess structure 42, which is not described in detail here.

Figure 9:
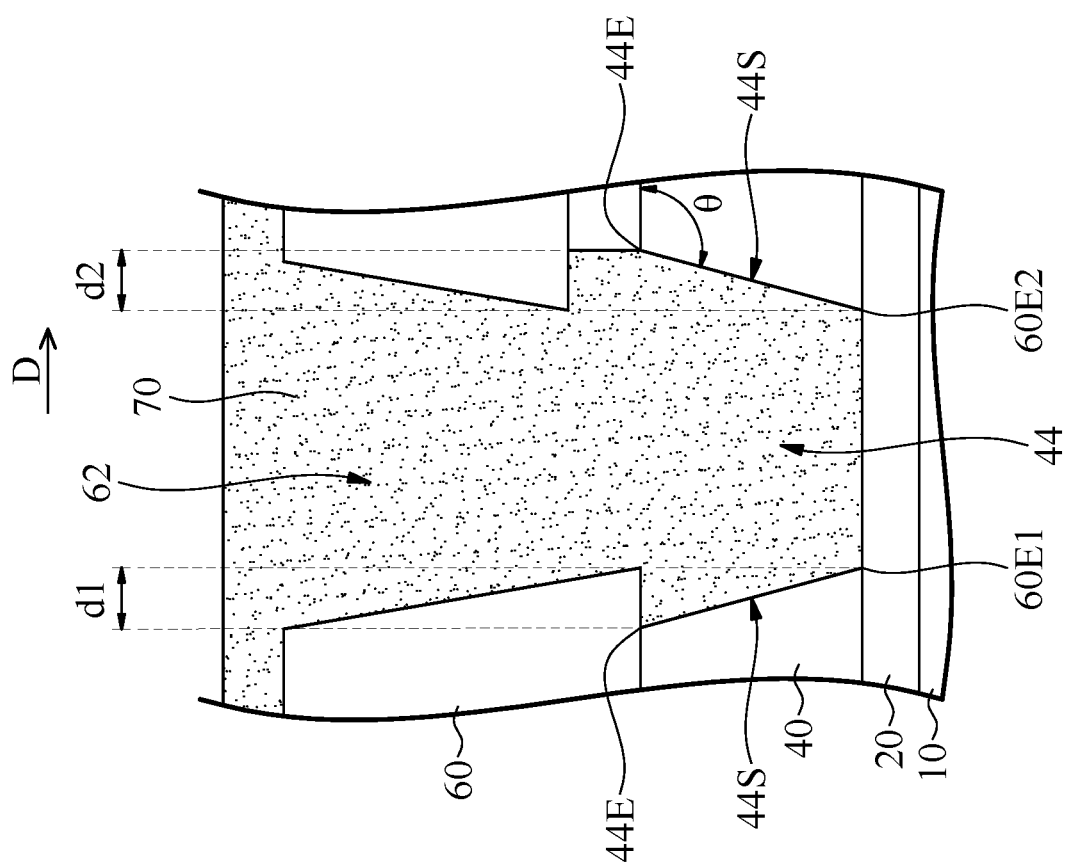
FIG. 9 is a cross-sectional view of the recess structure according to another embodiment of the present disclosure.

In the foregoing embodiment, the sidewall 42S of the recess structure 42 is substantially perpendicular to the top surfaces of the first dielectric layer 20 and the second dielectric layer 40, but the disclosure is not limited thereto. FIG. 9 is a cross-sectional view of the recess structure 44 according to another embodiment of the present disclosure. Moreover, in order to more clearly show the features of the recess structure 44, other components adjacent to the recess structure 44 are also shown in FIG. 9.

Referring to FIG. 9, the sidewall 44S of the recess structure 44 is not perpendicular to the top surface of the second dielectric layer 40. In some embodiments, the included angle θ between the top surface of the second dielectric layer 40 and the sidewall 44S of the recess structure 44 may be between 90 and 150 degrees, but the present disclosure is not limited thereto. When the included angle θ between the top surface of the second dielectric layer 40 and the sidewall 44S of the recess structure 44 is 90, the sidewall 44S of the recess structure 44 is substantially perpendicular to the top surfaces of the second dielectric layer 40.

Similarly, the projection of the structure layer 60 on the bottom surface of the recess structure 44 has an end portion 60E1 (or 60E2) corresponding to the opening 62, and the shortest distance d1 (or d2) between the end portion 60E1 (or 60E2) and the top 44E of the recess structure 42 in the direction D parallel with the top surface of the second dielectric layer 40 is larger than or equal to the thickness of the sacrificial layer 50 (or the thickness of the remaining portion of sacrificial layer 50R) (i.e., the height g of the chamber 80), which is not described in detail here.

Figure 10:
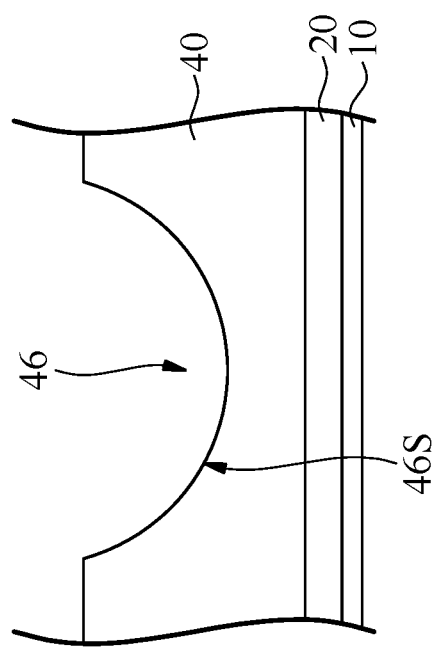
FIG. 10 is a cross-sectional view of the recess structure according to still another embodiment of the present disclosure.

FIG. 10 is a cross-sectional view of the recess structure 46 according to still another embodiment of the present disclosure. Referring to FIG. 10, the sidewall 46S of the recess structure 46 may be curved. The embodiments of FIG. 9 and FIG. 10 illustrate different examples of the recess structure of some embodiments of the present disclosure, but the recess structure of the embodiments of the present disclosure may also be formed into other different shapes, which may be determined based on actual demands.

Figure 11:
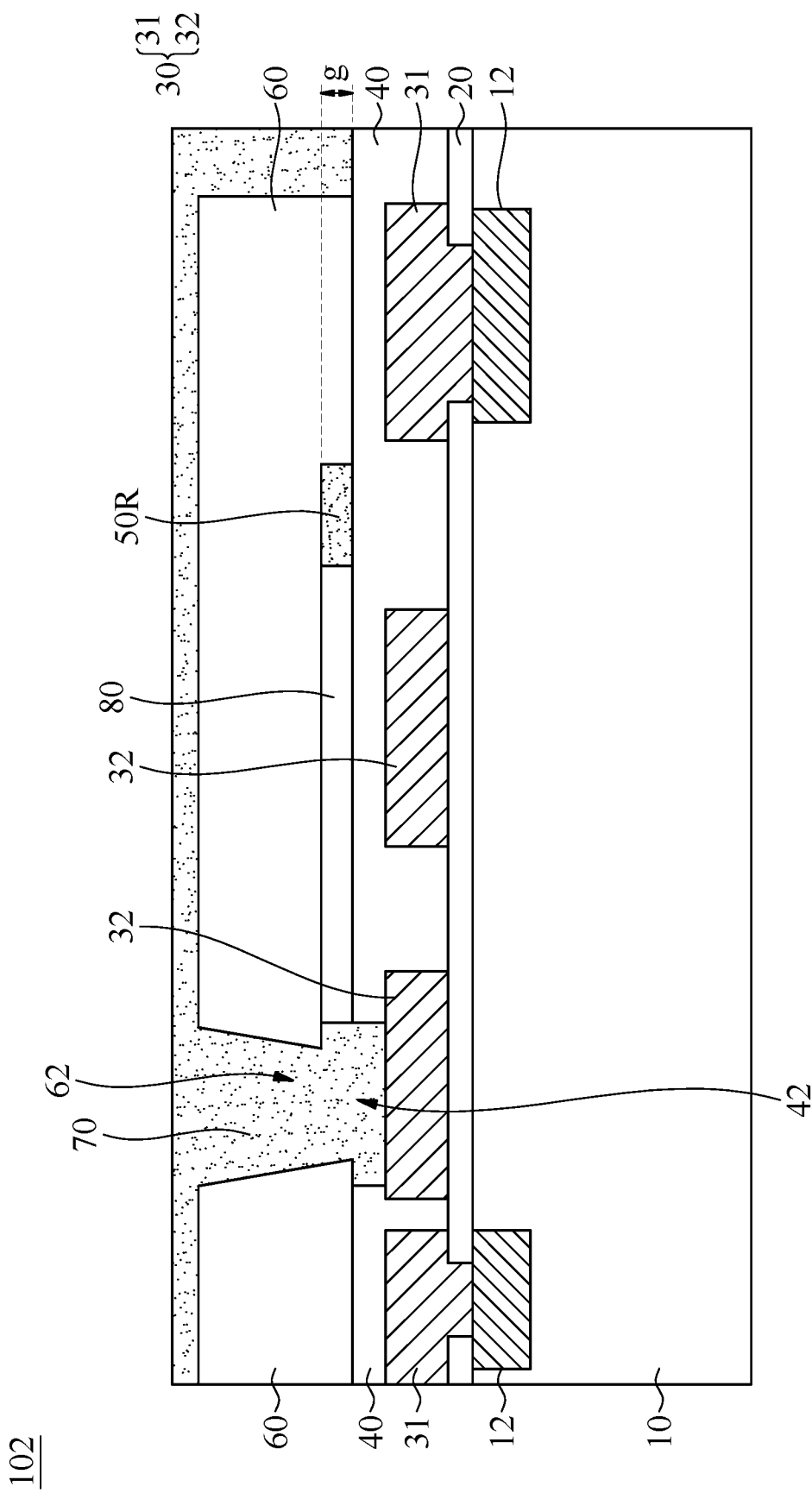
FIG. 11 is a cross-sectional view of the MEMS device according to some embodiments of the present disclosure.

FIG. 11 is a cross-sectional view of the MEMS device 102 according to some embodiments of the present disclosure. The structure and manufacturing method of the MEMS device 102 shown in FIG. 11 are similar to the MEMS device 100 shown in FIG. 8, and the difference is that the recess structure 42 of the MEMS device 102 exposes part of the top surface of the second portion 32 of the first metal layer 30, so that the sealing layer 70 may be in direct contact with part of the first metal layer 30 (i.e., the second portion 32 of the first metal layer 30), but the present disclosure is not limited thereto.

FIG. 12 to FIG. 22 are a series of cross-sectional views illustrating various stages of a method for manufacturing the integrated MEMS module 1 according to some embodiments of the present disclosure. FIG. 23 is a partial top view illustrating the integrated MEMS module 1. Similarly, in order to more clearly show the features of the embodiments of the present disclosure, some components may be omitted in FIG. 12 to FIG. 23.

In some embodiments of the present disclosure, the integrated MEMS module 1 may include a plurality of MEMS devices (e.g., MEMS device 106 and MEMS device 108). The structures of these MEMS devices may similar to the MEMS device 100 shown in FIG. 8 or the MEMS device 102 shown in FIG. 11, and be formed by the manufacturing method shown in FIG. 1 to FIG. 8, but the present disclosure is not limited thereto. FIG. 12 to FIG. 22 may present a method for manufacturing the MEMS device 106 and the MEMS device 108, which is different from the embodiment shown in FIG. 1 to FIG. 8.

Figure 12:
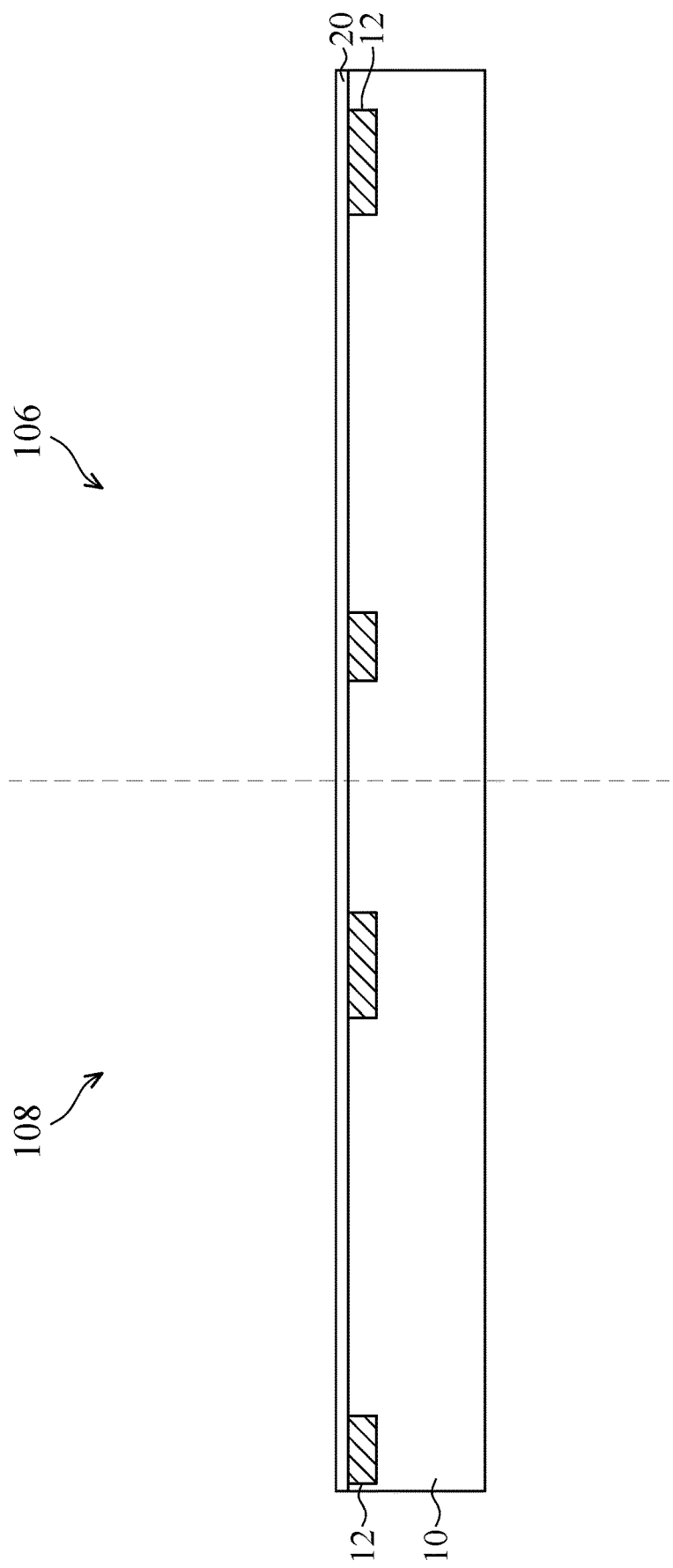
FIG. 12 is a cross-sectional view illustrating the integrated MEMS module at one stage of manufacture according to some embodiments of the present disclosure.

Referring to FIG. 12, firstly, a substrate 10 is provided. The substrate 10 may have a plurality of contacts 12. Then, a first dielectric layer 20 is formed on the substrate 10. Examples of the materials and forming methods of the substrate 10 and the first dielectric layer 20 are as described above, and will not be repeated here.

Figure 13:
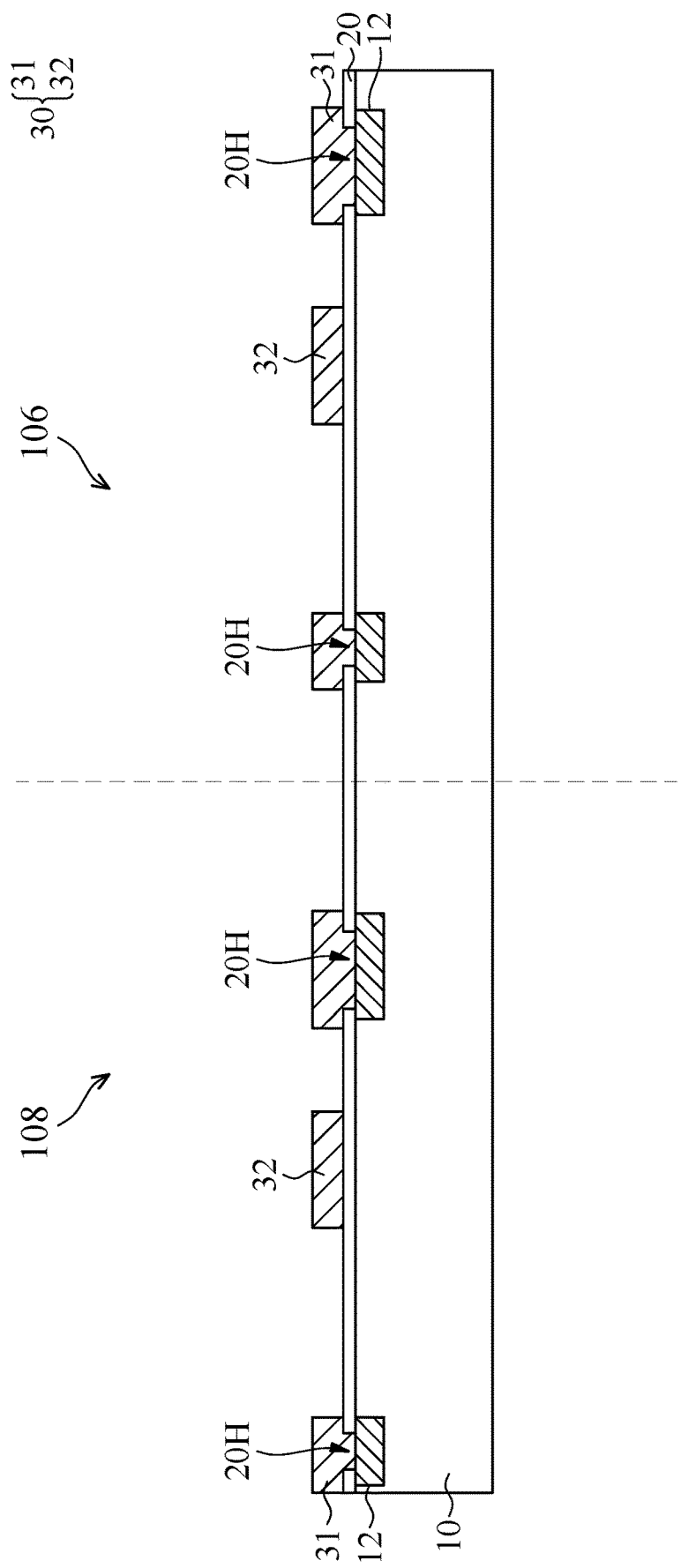
FIG. 13 is a cross-sectional view illustrating the integrated MEMS module at one stage of manufacture according to some embodiments of the present disclosure.

Referring to FIG. 13, a plurality of through holes 20H are formed in the first dielectric layer 20. The through holes 20H may be disposed on and correspond to the contacts 12 and also expose a portion of the top surface of the contact 12. Then a first metal layer 30 is formed on the first dielectric layer 20, wherein at least a portion of the first metal layer 30 is electrically connected to the contact 12. In particular, as shown in FIG. 13, the first metal layer 30 may include a plurality of first portions 31 and a plurality of second portions 32. The first portions 31 may directly contact with the contacts 12 through the through holes 20H of the first dielectric layer 20, and the second portions 32 may be separated from the contacts 12 by the first dielectric layer 20. That is, the first portions 31 of the first metal layer 30 may be electrically connected to the contacts 12, and the second portions 32 of the first metal layer 30 may be electrically isolated from the contacts 12, but the present disclosure is not limited thereto. Examples of the materials and forming methods of the first dielectric layer 20 and the first metal layer 30 are as described above, and will not be repeated here.

Figure 14:
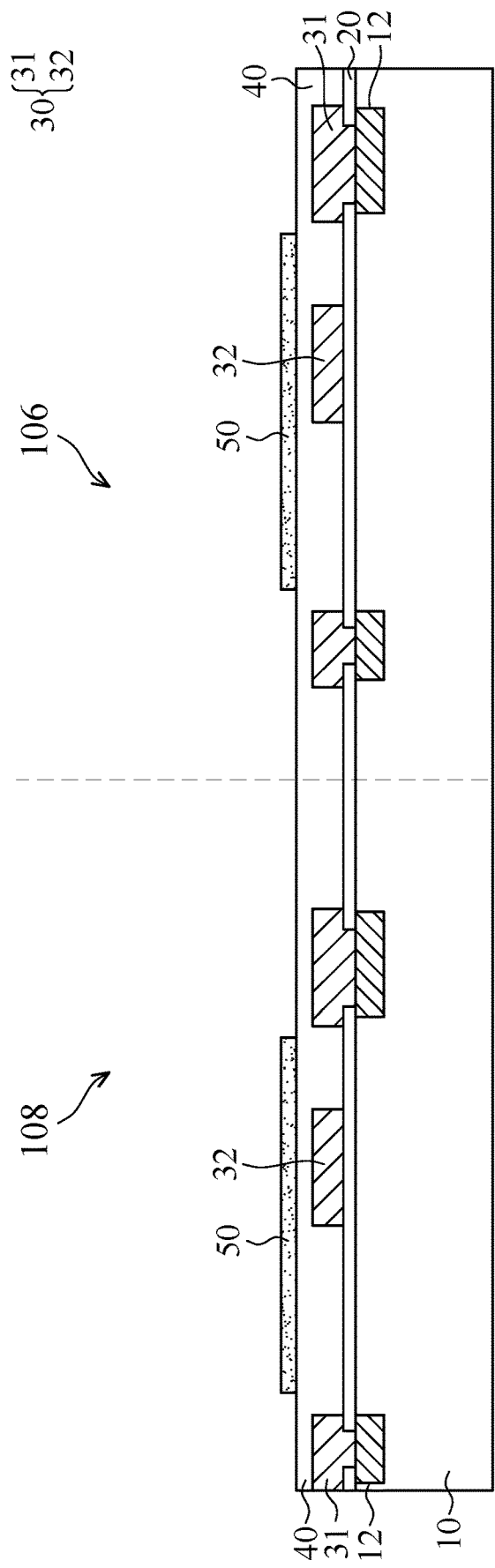
FIG. 14 is a cross-sectional view illustrating the integrated MEMS module at one stage of manufacture according to some embodiments of the present disclosure.

Referring to FIG. 14, a second dielectric layer 40 is formed on the first dielectric layer 20 and the first metal layer 30. Then, a sacrificial layer 50 is formed on the second dielectric layer 40. Similarly, the sacrificial layer 50 may have a high etching selectivity comparing to the first dielectric layer 20, the first metal layer 30, and the second dielectric layer 40. Therefore, during the subsequent process of removing the sacrificial layer 50, the first dielectric layer 20, the first metal layer 30, and the second dielectric layer 40 may be prevented from being damaged. Examples of the materials and forming methods of the second dielectric layer 40 and the sacrificial layer 50 are as described above, and will not be repeated here.

Figure 15:
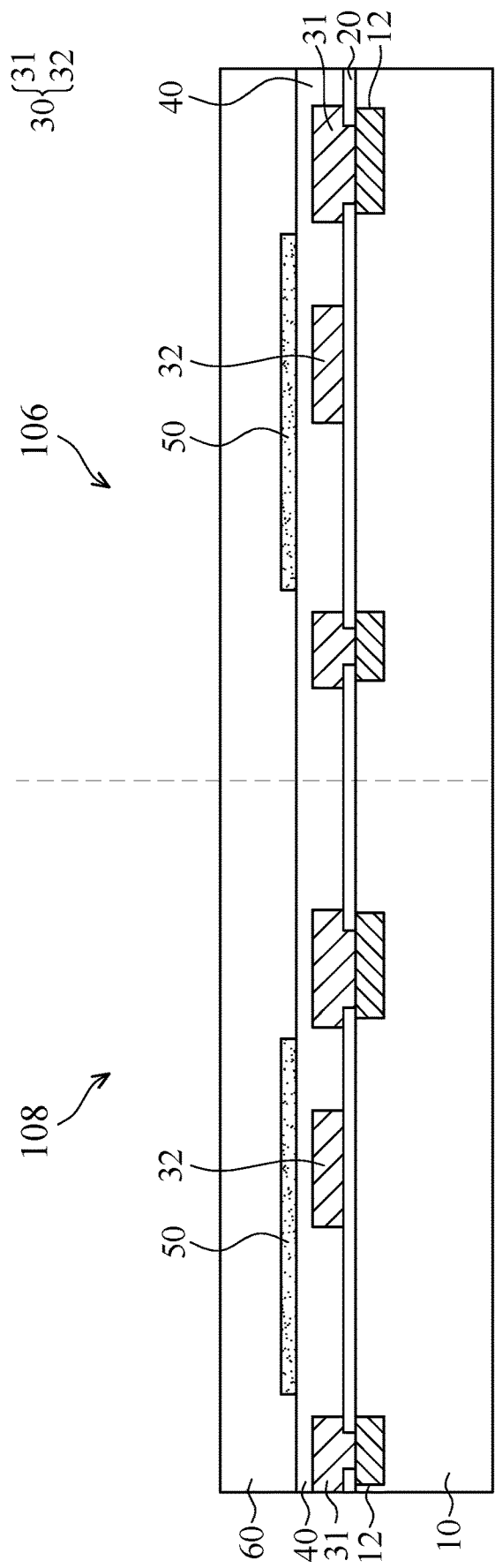
FIG. 15 is a cross-sectional view illustrating the integrated MEMS module at one stage of manufacture according to some embodiments of the present disclosure.

Referring to FIG. 15, a structure layer 60 is formed on the second dielectric layer 40 and the sacrificial layer 50. Similarly, the sacrificial layer 50 may also have a high etching selectivity comparing to the structure layer 60, and the structure layer 60 may be considered as a part of a MEMS substrate. Examples of the material and forming method of the structure layer 60 are as described above, and will not be repeated here.

Figure 16:
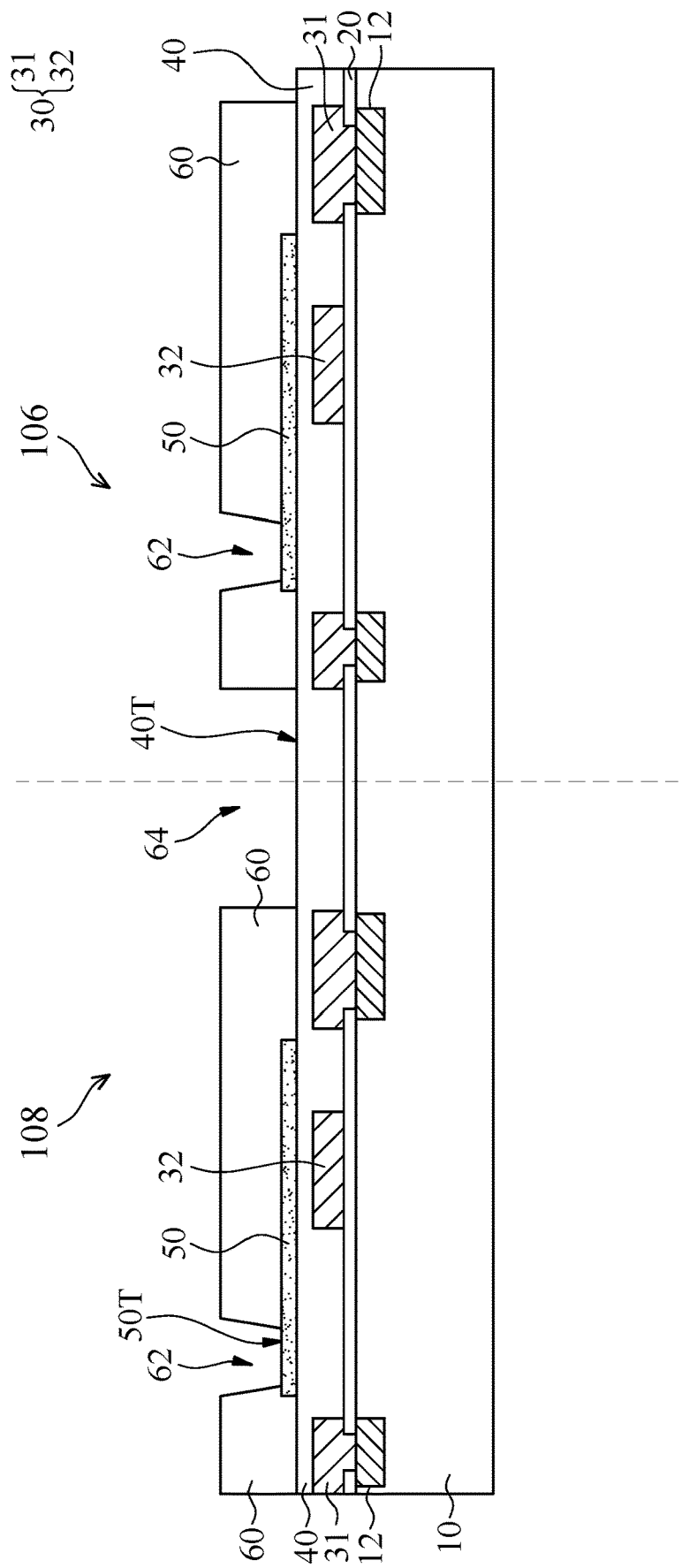
FIG. 16 is a cross-sectional view illustrating the integrated MEMS module at one stage of manufacture according to some embodiments of the present disclosure.

Referring to FIG. 16, a portion of the structure layer 60 is removed to form openings 62. As shown in FIG. 16, the openings 62 may expose a portion of the top surface 50T of the sacrificial layer 50. In some embodiments, a patterning process may be performed on the structure layer 60 to remove a portion of the structure layer 60 and form the openings 62. The example of the patterning process is as described above, and will not be repeated here. Moreover, as shown in FIG. 16, when the patterning process is performed on the structure layer 60, an opening 64 may also be formed simultaneously. The opening 64 may expose a portion of the top surface 40T of the second dielectric layer 40, and the MEMS device 106 and the MEMS device 108 to be formed subsequently may be separated from each other through the opening 64, but the present disclosure is not limited thereto.

Figure 17:
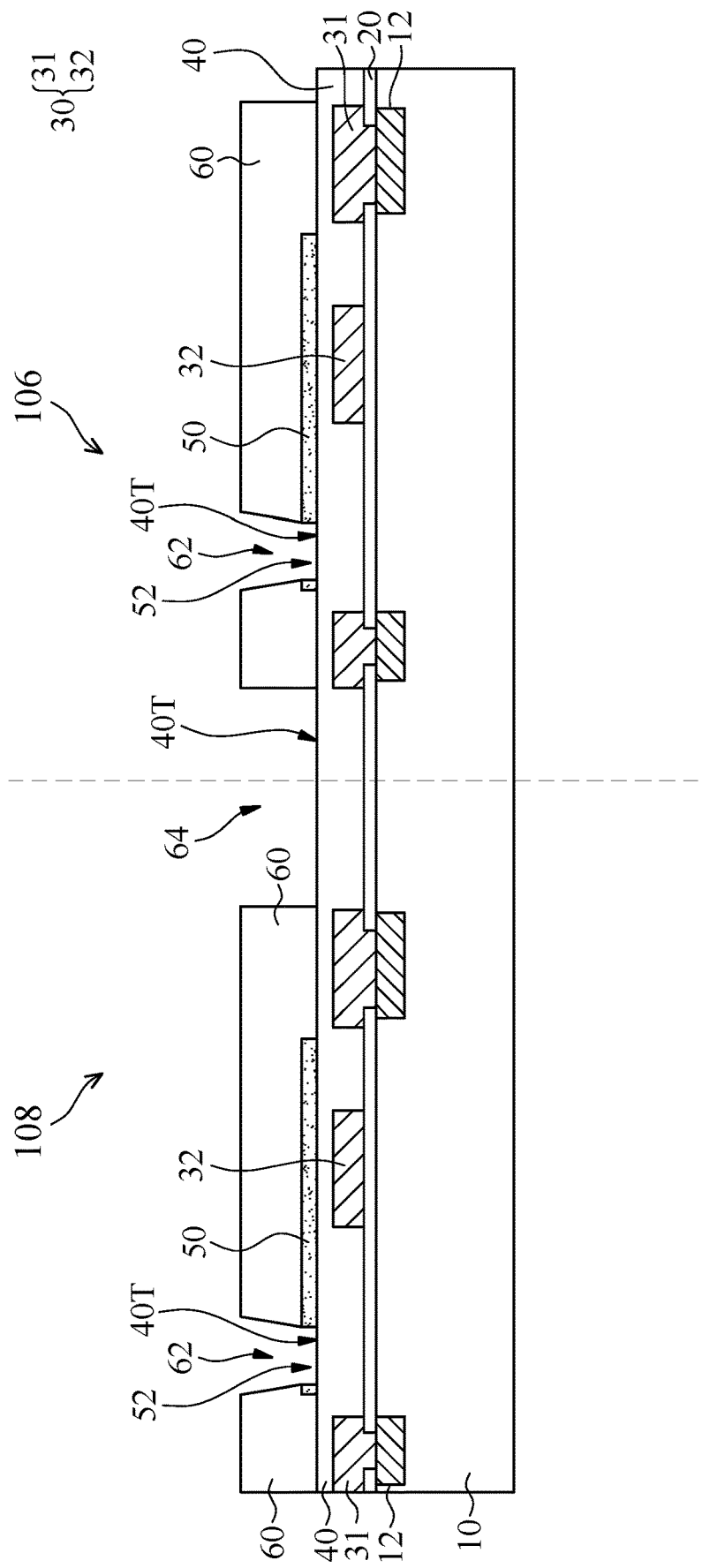
FIG. 17 is a cross-sectional view illustrating the integrated MEMS module at one stage of manufacture according to some embodiments of the present disclosure.

Referring to FIG. 17, a portion of the sacrificial layer 50 is removed through the openings 62 to form openings 52, and the openings 52 expose a portion of the top surface 40T of the second dielectric layer 40. For example, a patterning process may be performed on the sacrificial layer 50 to remove a portion of the sacrificial layer 50 and form the openings 52. The example of the patterning process is as described above, and will not be repeated here.

Figure 18:
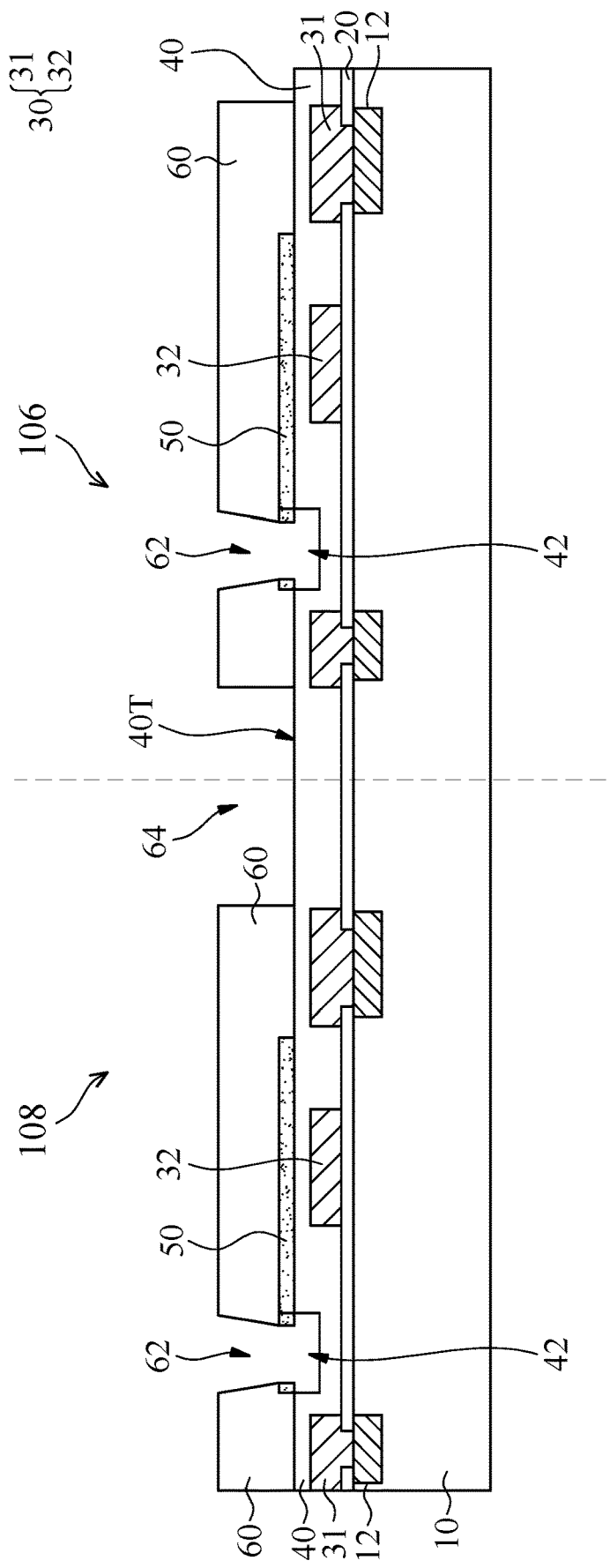
FIG. 18 is a cross-sectional view illustrating the integrated MEMS module at one stage of manufacture according to some embodiments of the present disclosure.

Referring to FIG. 18, a portion of the second dielectric layer 40 is removed through the openings 52 to form recess structures 42. For example, a patterning process (e.g., that includes a lateral etching process) may be performed on the second dielectric layer 40 to remove a portion of the second dielectric layer 40 and form the recess structures 42. The example of the patterning process is as described above, and will not be repeated here.

Figure 19:
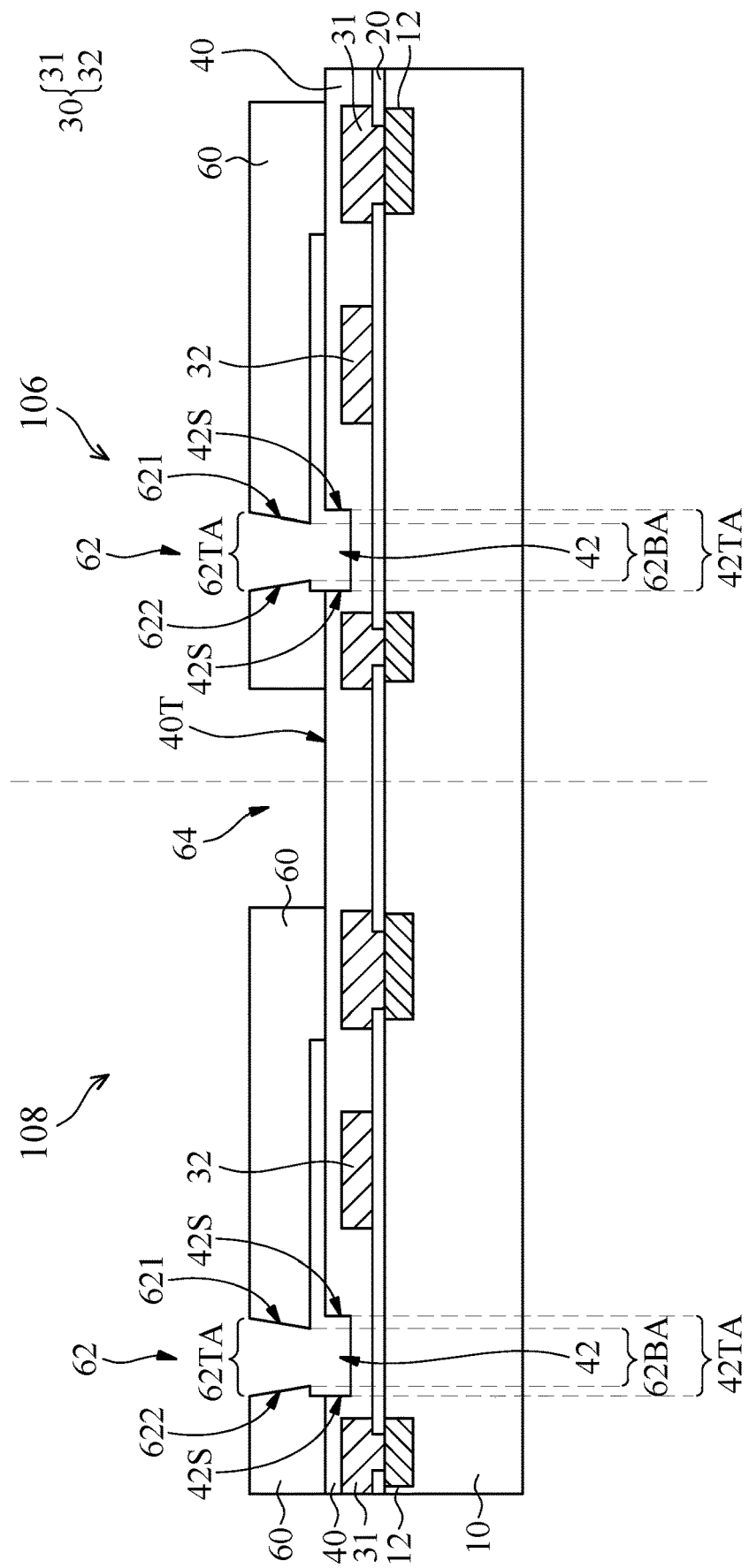
FIG. 19 is a cross-sectional view illustrating the integrated MEMS module at one stage of manufacture according to some embodiments of the present disclosure.

Referring to FIG. 19, the sacrificial layer 50 is removed. For example, a wet etching process may be performed to remove the sacrificial layer 50. The example of the wet etching process is as described above, and will not be repeated here. Similarly, since the sacrificial layer 50 may have a high etching selectivity comparing to the first dielectric layer 20, the first metal layer 30, the second dielectric layer 40, and the structure layer 60, the first dielectric layer 20, the first metal layer 30, the second dielectric layer 40, and the structure layer 60 may be prevented from being damaged during the process of removing the sacrificial layer 50. In this embodiment, the sacrificial layer 50 is completely removed, but the present disclosure is not limited thereto. In some other embodiments, part of the sacrificial layer 50 may be retained.

As shown in FIG. 19, in some embodiments, the cross-sectional area 62BA at the bottom of the opening 62 is smaller than the cross-sectional area 42TA at the top of the recess structure 42. Moreover, in some embodiments, the cross-sectional area 62BA at the bottom of the opening 62 is smaller than the cross-sectional area 62TA at the top of the opening 62. In particular, the cross-sectional areas of the openings 62 at different depths are not constant and may be continuously changed. For example, as shown in FIG. 19, in cross-sectional areas of the openings 62 at this stage, the sidewall 621 and the sidewall 622 of the opening 62 may be presented as two incline surfaces, but the present disclosure is not limited thereto.

In this embodiment, the sidewall 42S of the recess structure 42 may be substantially perpendicular to the top surface 40T of the second dielectric layer 40 (and/or the top surface of the first dielectric layer 20), but the present disclosure is not limited thereto. In some other embodiments, it is also possible to adjust (or control) the wet etching process to make the recess structure 42 similar to the recess structure 44 shown in FIG. 9 or the recess structure 46 shown in FIG. 10. The shape and depth of the recess structure 42 may be adjusted based on demands.

Figure 20:
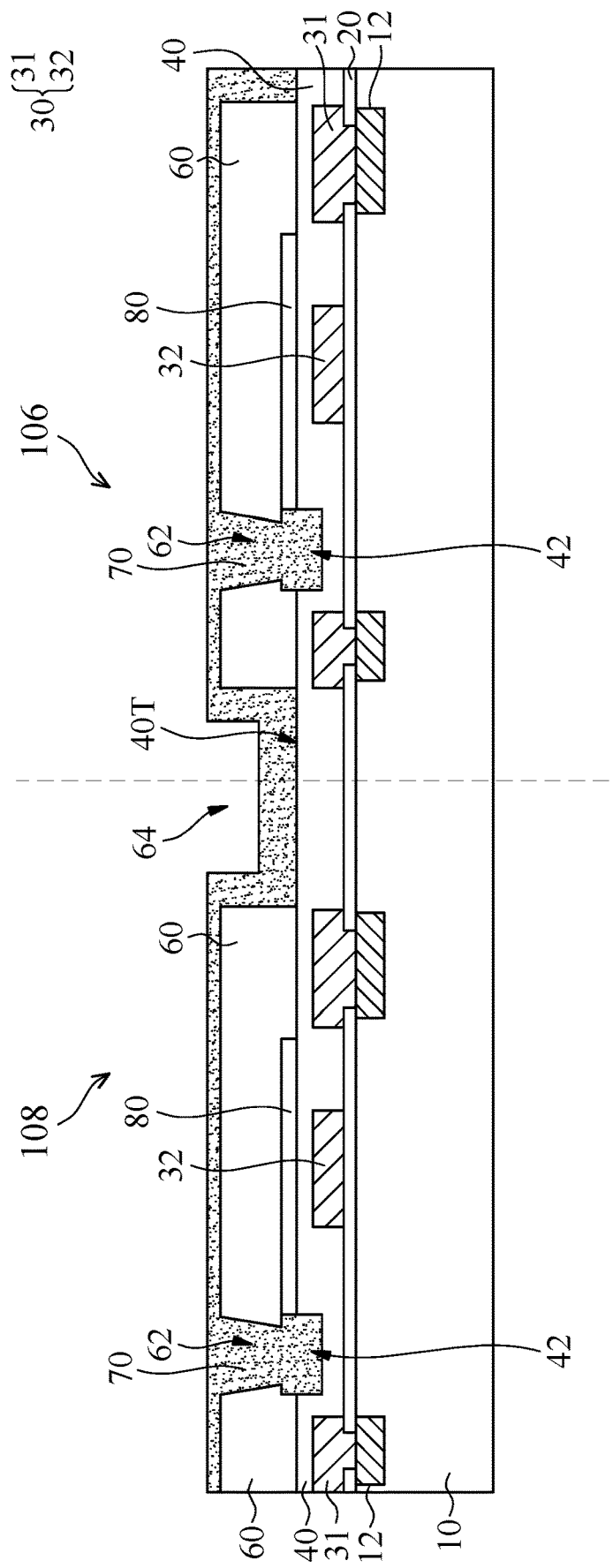
FIG. 20 is a cross-sectional view illustrating the integrated MEMS module at one stage of manufacture according to some embodiments of the present disclosure.

Referring to FIG. 20, a sealing layer 70 is formed. In particular, at least a portion of the sealing layer 70 may be formed in the openings 62 and the recess structures 42. That is, the sealing layer 70 may be continuously formed and fill the space in which the openings 62 and the recess structures 42 are located, so that the second dielectric layer 40, the structure layer 60, and the sealing layer 70 may define chambers 80. In other words, the chamber 80 may partially or completely replace the space occupied by the original sacrificial layer 50 which is between the second dielectric layer 40 and the structure layer 60. That is, the chamber 80 is between the second dielectric layer 40, the structure layer 60, and the sealing layer 70. Examples of the material and forming method of the sealing layer 70 are as described above, and will not be repeated here.

Here, the sealing layer 70 may be regarded as the sealing structure of the MEMS device 106 and the MEMS device 108. In addition, as shown in FIG. 20, part of the sealing layer 70 may be formed on the structure layer 60 and formed on a portion of the top surface 40T of the second dielectric layer 40 exposed by the opening 64 and the sidewalls of the opening 64, but the present disclosure is not limited thereto.

As shown in FIG. 20, in some embodiments, the recess structure 42 may be disposed on the first dielectric layer 20 and not expose the first dielectric layer 20, so that the sealing layer 70 may directly contact with the second dielectric layer 40, but the present disclosure is not limited thereto.

In a general MEMS (device) that does not have a recess structure, since the formation (deposition) speed of the portion corresponding to the center of the opening 62 is greater than the formation (deposition) speed of the portion away from the center of the opening 62 during the process of forming (depositing) the sealing layer 70, it is easy to form a sealing seam. In contrast, in this embodiment, the recess structure 42 is formed through the opening 52, and the opening 52 is formed through the opening 62, so that the recess structure may correspond to the opening 62. Therefore, the recess structure 42 may effectively prevent the generation of the sealing seam during the formation of the sealing layer 70.

Moreover, in some embodiments of the present disclosure, since the cross-sectional area 62BA at the bottom of the opening 62 is smaller than the cross-sectional area 62TA at the top of the opening 62, the sealing layer 70 may be formed in the opening 62 more uniformly, thereby avoiding the hollow structure caused by the early closing of the recess structure 42 and the opening 62 before the sealing layer 70 has been fully filled.

In this stage, the MEMS device 106 of the integrated MEMS module 1 has been completed. In some embodiments, the MEMS device 106 may be used as a pressure sensor, but the present disclosure is not limited thereto. In the subsequent stages from FIG. 21 to FIG. 22, it is performed for the MEMS device 108.

Figure 21:
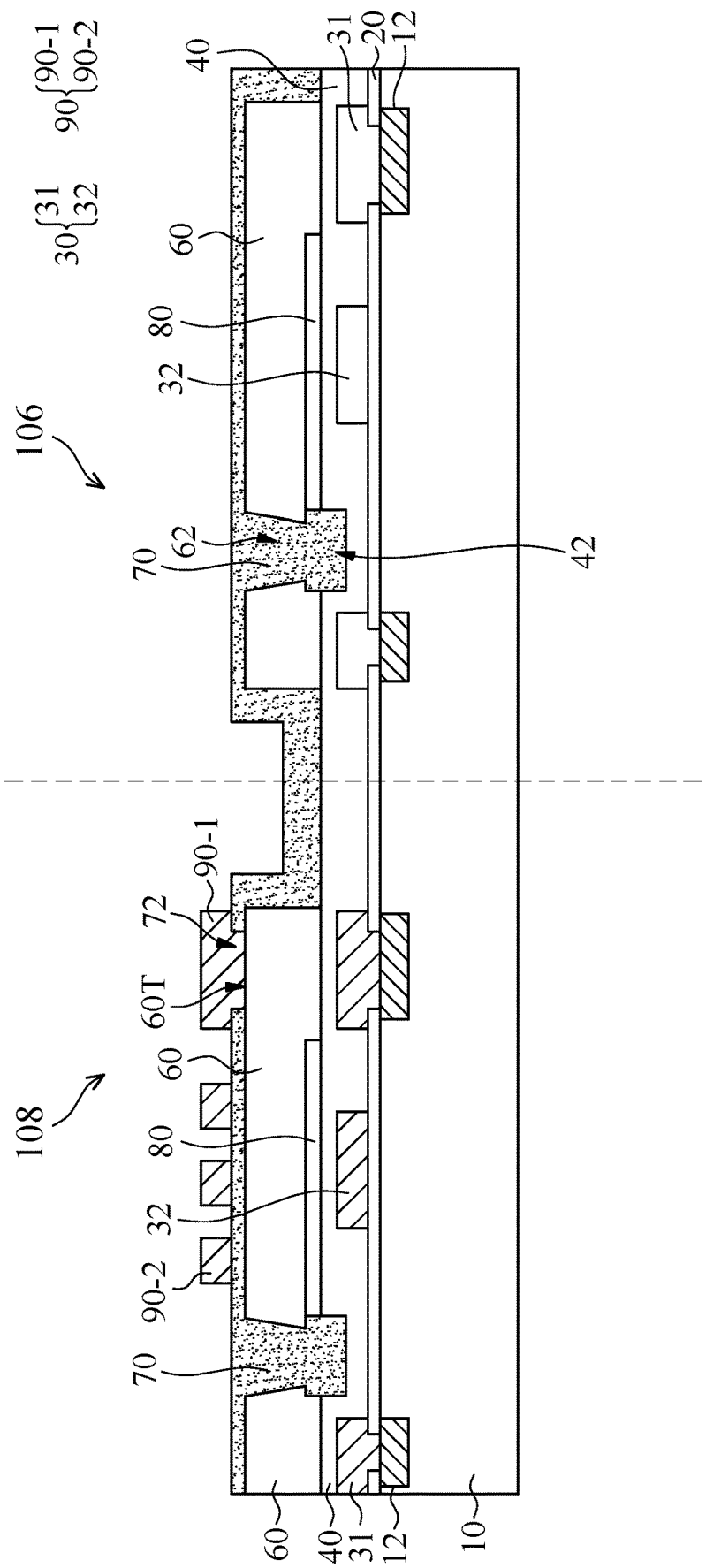
FIG. 21 is a cross-sectional view illustrating the integrated MEMS module at one stage of manufacture according to some embodiments of the present disclosure.

Referring to FIG. 21, in some embodiments, a portion of the sealing layer 70 may be removed to form an opening 72, and the opening 72 exposes a portion of the top surface 60T of the structure layer 60. For example, as shown in FIG. 21, a portion of the sealing layer 70 where the MEMS device 108 is to be formed may be removed to form the opening 72, but another portion of the sealing layer 70 where the MEMS device 106 has been formed is still remained completely.

Then, a second metal layer 90 may be formed on the sealing layer 70, wherein at least a portion of the second metal layer 90 is formed in the opening 72. In particular, as shown in FIG. 21, the second metal layer 90 may include a first portion 90-1 and a second portion 90-2, wherein the first portion 90-1 directly contacts with the structure layer 60 (i.e., the first portion 90-1 may be disposed in the opening 72), and the second portion 90-2 directly contacts with the sealing layer 70 (but separated from the structure layer 60). Examples of the material and forming method of the second metal layer 90 may be similar to those of the first metal layer 30, and will not be repeated here.

Figure 22:
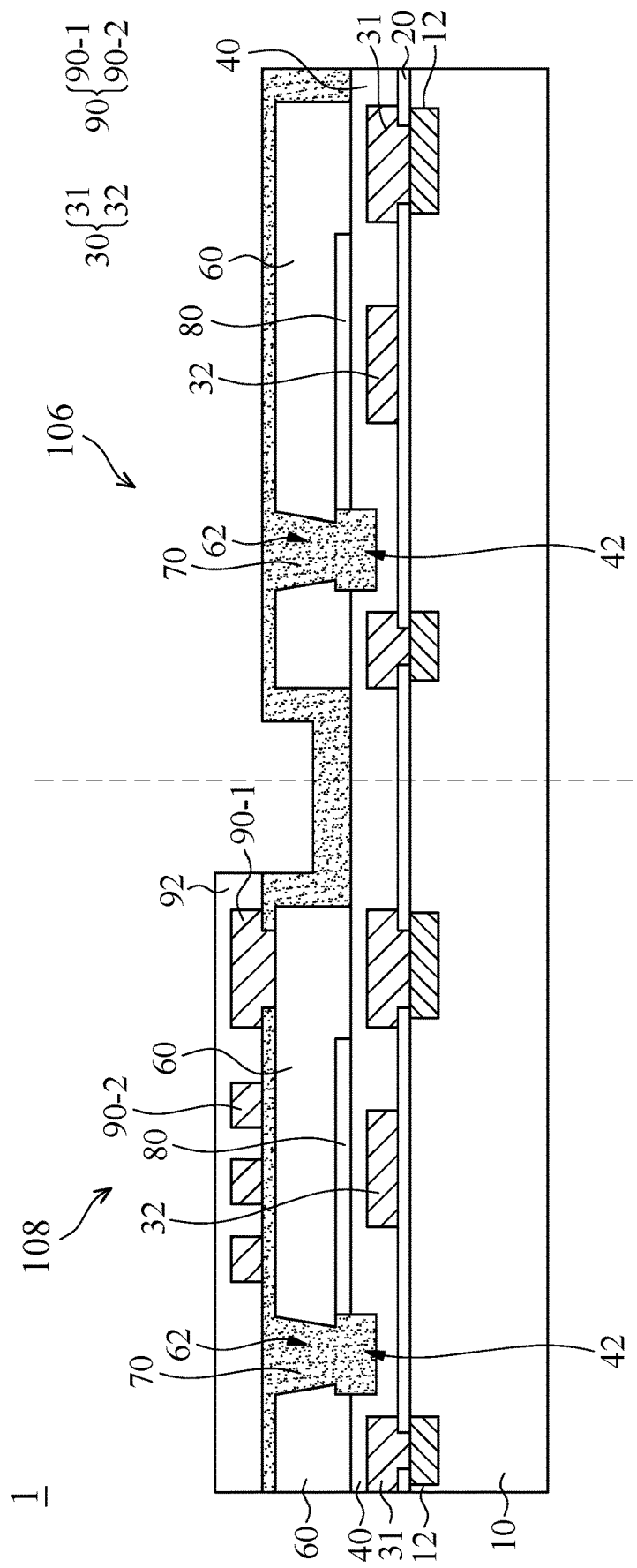
FIG. 22 is a cross-sectional view illustrating the integrated MEMS module at one stage of manufacture according to some embodiments of the present disclosure.
Figure 23:
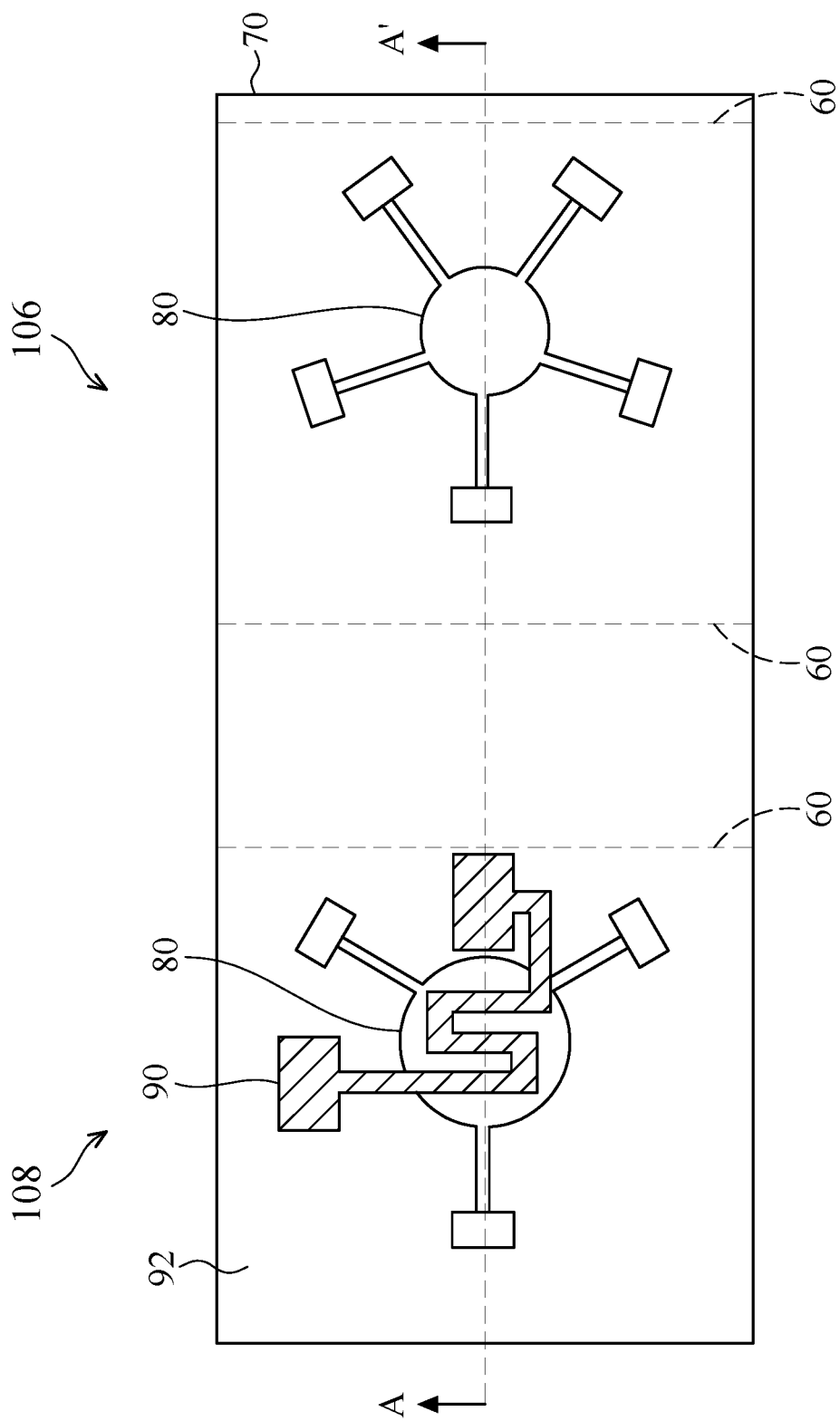
FIG. 23 is a partial top view illustrating the integrated MEMS module.

Referring to FIG. 22, in some embodiments, a third dielectric layer 92 may be formed on the sealing layer 70 and the second metal layer 90. In particular, as shown in FIG. 22, the third dielectric layer 92 may cover the sealing layer 70 and the second metal layer 90, but the present disclosure is not limited thereto. Examples of the material and forming method of the third dielectric layer 92 may be similar to those of the first dielectric layer 20 or the second dielectric layer 40, and will not be repeated here.

In this stage, the MEMS device 108 of the integrated MEMS module 1 has been completed. In some embodiments, the MEMS device 108 may be used as a temperature sensor, but the present disclosure is not limited thereto.

Referring to FIG. 22 and FIG. 23, the integrated MEMS module 1 may include the MEMS device 106 and the MEMS device 108. The MEMS device 106 and the MEMS device 108 may form on the same substrate 10. Moreover, the MEMS device 106 may be used as a pressure sensor, and the MEMS device 108 may be used as a temperature sensor. That is, according to some embodiments of the present disclosure, at least two MEMS devices with different structures or functions may be simultaneously formed in the integrated MEMS module 1. In contrast, in traditional MEMS module, different MEMS devices need to be formed separately and then integrated with each other through another circuit board. Compared with the traditional MEMS module, the manufacturing method of the embodiments of the present disclosure may effectively reduce the overall size of the integrated MEMS module 1 and simplify the process steps.

It should be noted that the position and shape of the chamber 80 are not limited to those shown in FIG. 23, and may be adjusted based on actual demands.

Figure 24:
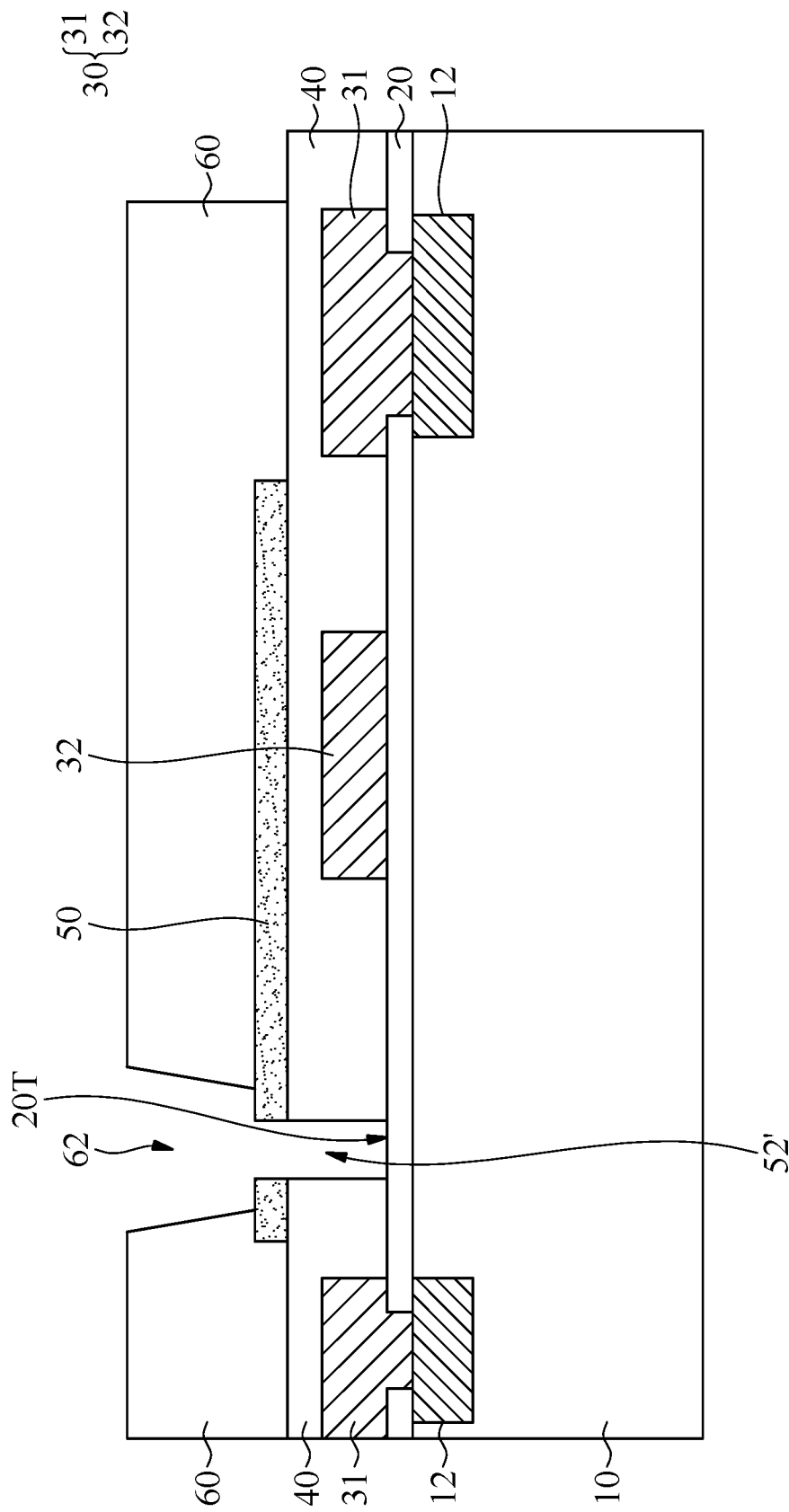
FIG. 24 is a cross-sectional view illustrating the integrated MEMS module at one stage of manufacture according to some other embodiments of the present disclosure.
Figure 25:
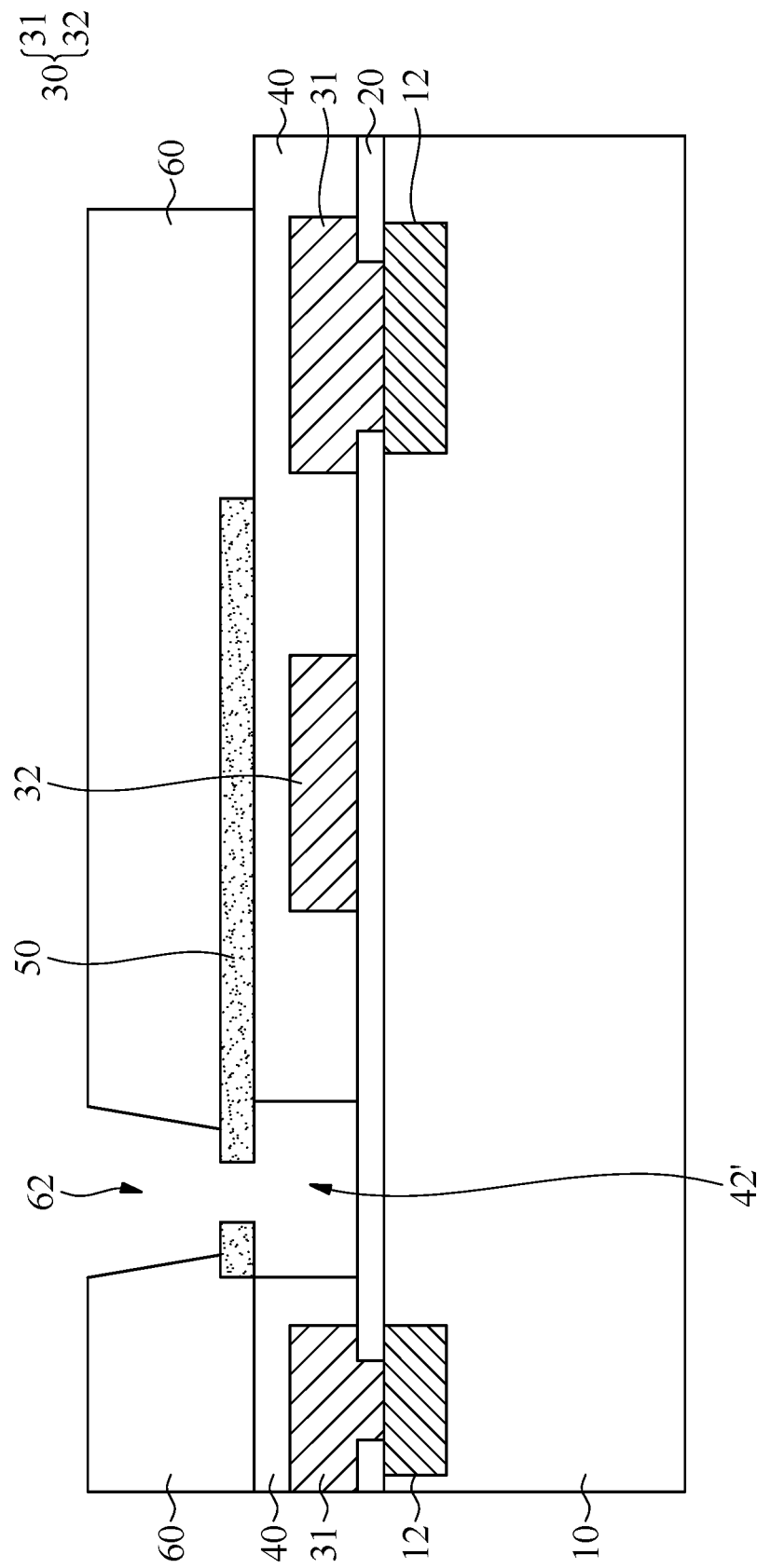
FIG. 25 is a cross-sectional view illustrating the integrated MEMS module at one stage of manufacture according to some other embodiments of the present disclosure.

FIG. 24 to FIG. 25 are a series of cross-sectional views illustrating different stages of a method for manufacturing the integrated MEMS module 1 according to some other embodiments of the present disclosure. For example, the steps shown in FIG. 24 to FIG. 25 may replace the steps shown in FIG. 17 to FIG. 18, but the present disclosure is not limited thereto. In addition, FIG. 24 to FIG. 25 are only shown one MEMS device, and this MEMS device may represent the MEMS device 106 or the MEMS device 108.

Referring to FIG. 24, a portion of the sacrificial layer 50 is removed through the opening 62 to form an opening 52'. Here, the top area of the opening 52' is not equal to the bottom area of the opening 62. In this step, the position and depth of the recess structure to be subsequently formed will be determined. For example, as shown in FIG. 24, the opening 52' may expose a portion of the top surface 20T of the first dielectric layer 20 in this embodiment, but the present disclosure is not limited thereto.

Referring to FIG. 25, a patterning process (e.g., that includes a lateral etching process) may be performed to remove a portion of the second dielectric layer 40 and form the recess structure 42'. Then, the steps shown in FIG. 19 and FIG. 20 may be followed to remove (partially or completely) the sacrificial layer 50 and form the sealing layer 70. In this embodiment, the recess structure 42' may expose a portion of the top surface 20T of the first dielectric layer 20, so that the sealing layer 70 may directly contact with the first dielectric layer 20, but the present disclosure is not limited thereto.

Figure 27:
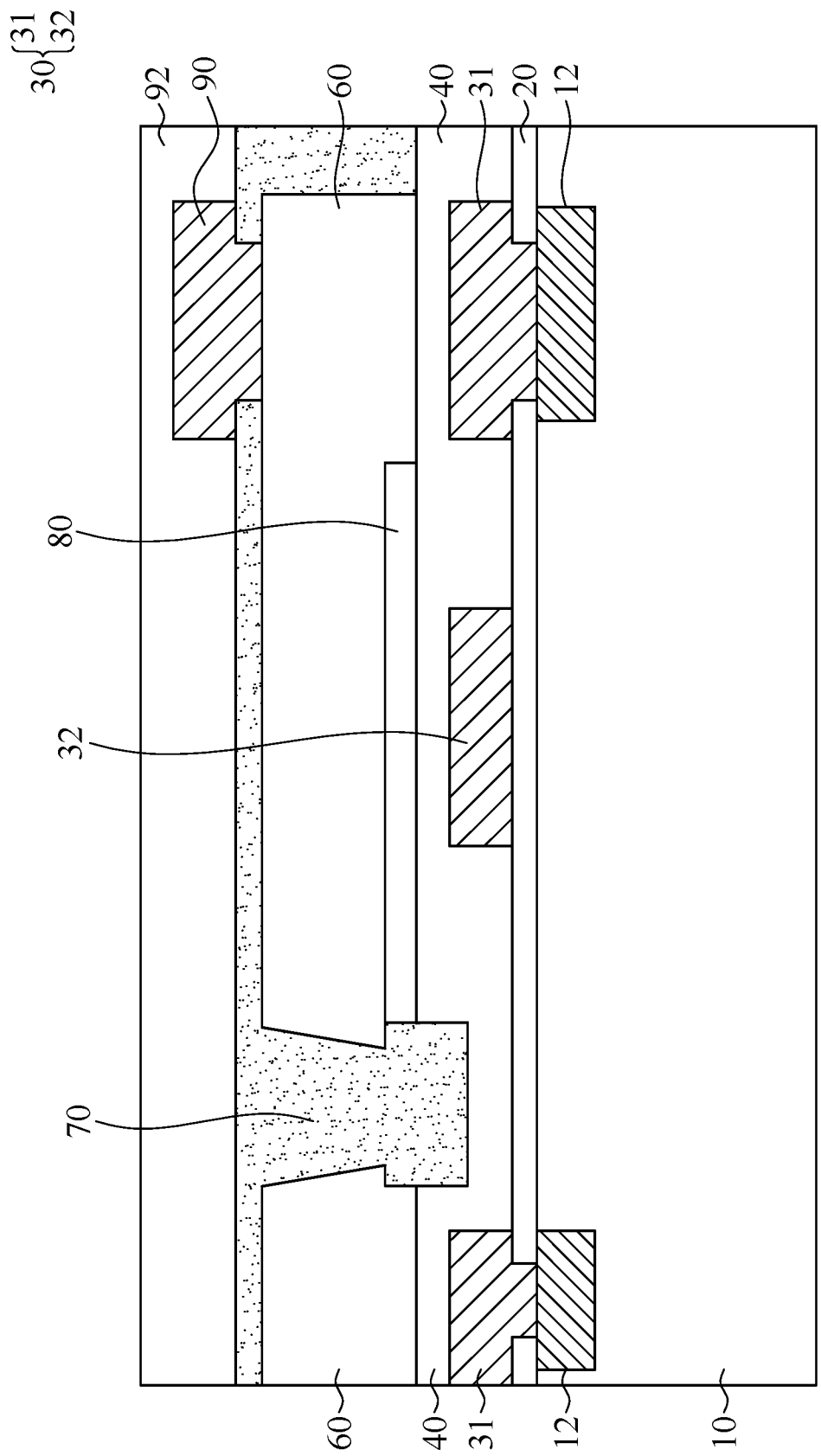
FIG. 27 is a cross-sectional view illustrating the integrated MEMS module at one stage of manufacture according to some other embodiments of the present disclosure.
Figure 28:
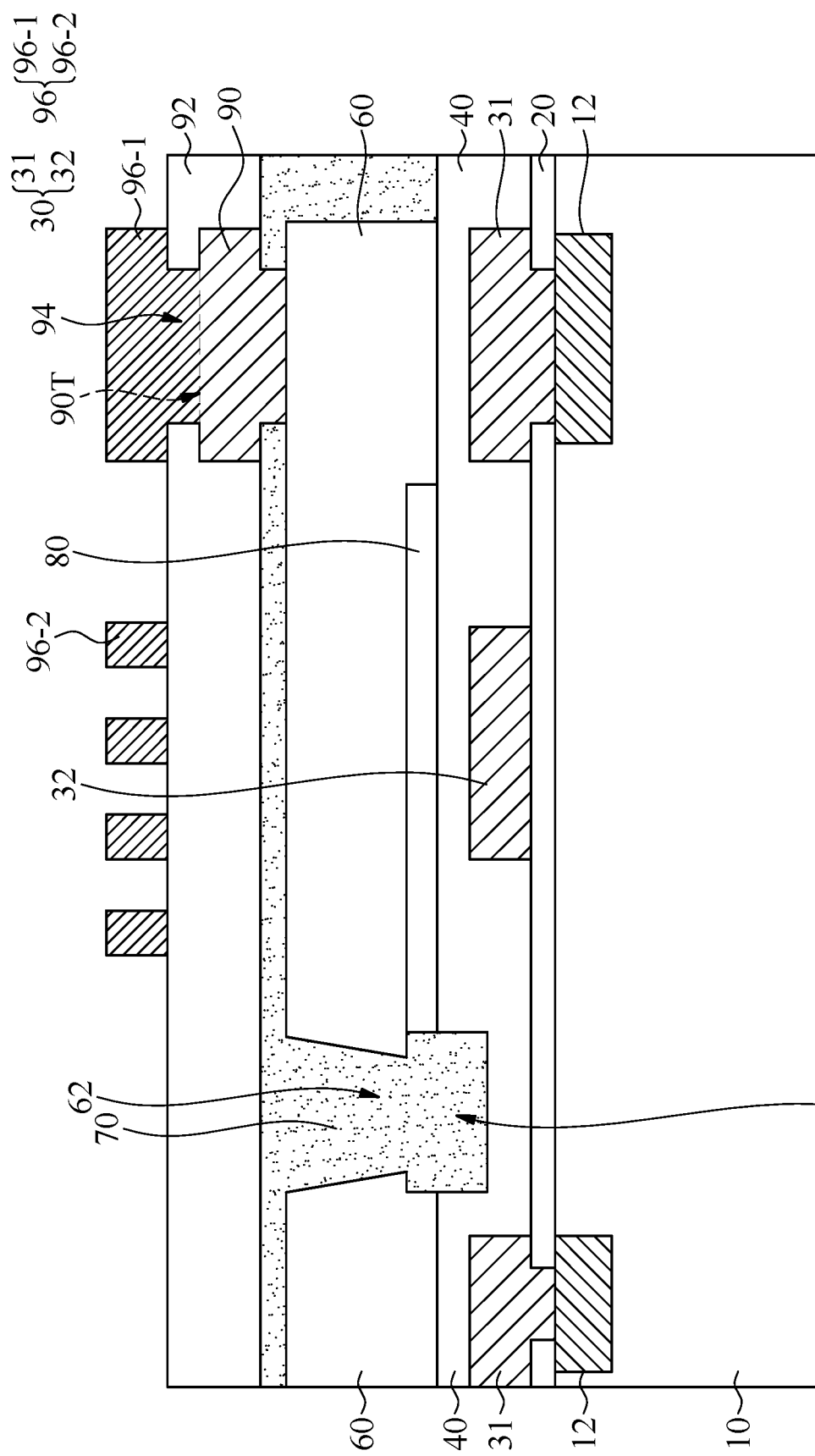
FIG. 28 is a cross-sectional view illustrating the integrated MEMS module at one stage of manufacture according to some other embodiments of the present disclosure.
Figure 29:
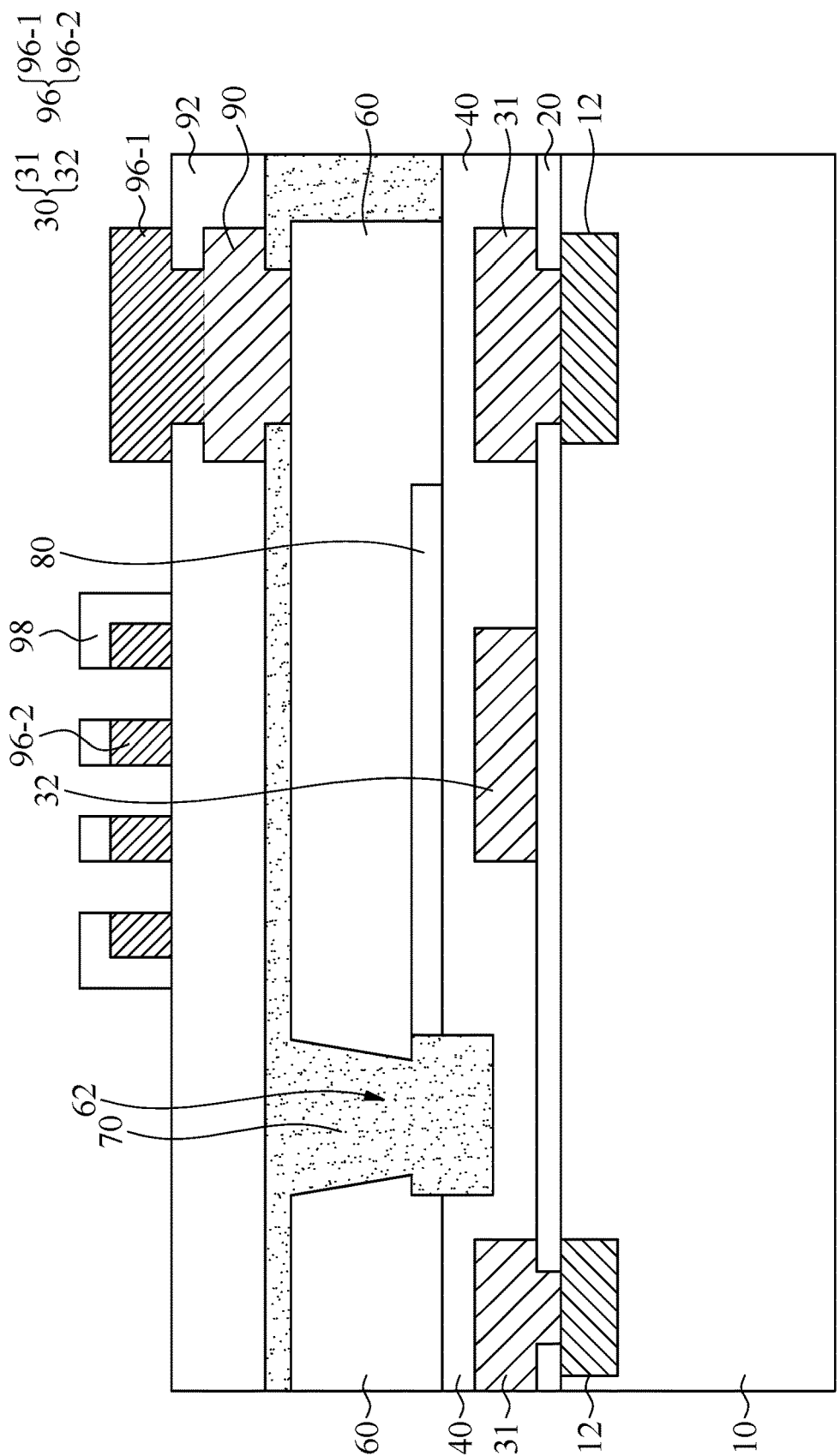
FIG. 29 is a cross-sectional view illustrating the integrated MEMS module at one stage of manufacture according to some other embodiments of the present disclosure.

FIG. 26 to FIG. 29 are a series of cross-sectional views illustrating different stages of a method for manufacturing the integrated MEMS module 1 according to some other embodiments of the present disclosure. For example, the steps shown in FIG. 26 to FIG. 29 may replace the steps shown in FIG. 21 to FIG. 22, but the present disclosure is not limited thereto. In addition, FIG. 29 is only shown one MEMS device 110, and the MEMS device 110 may replace the MEMS device 106 or the MEMS device 108 shown in FIG. 22.

Figure 26:
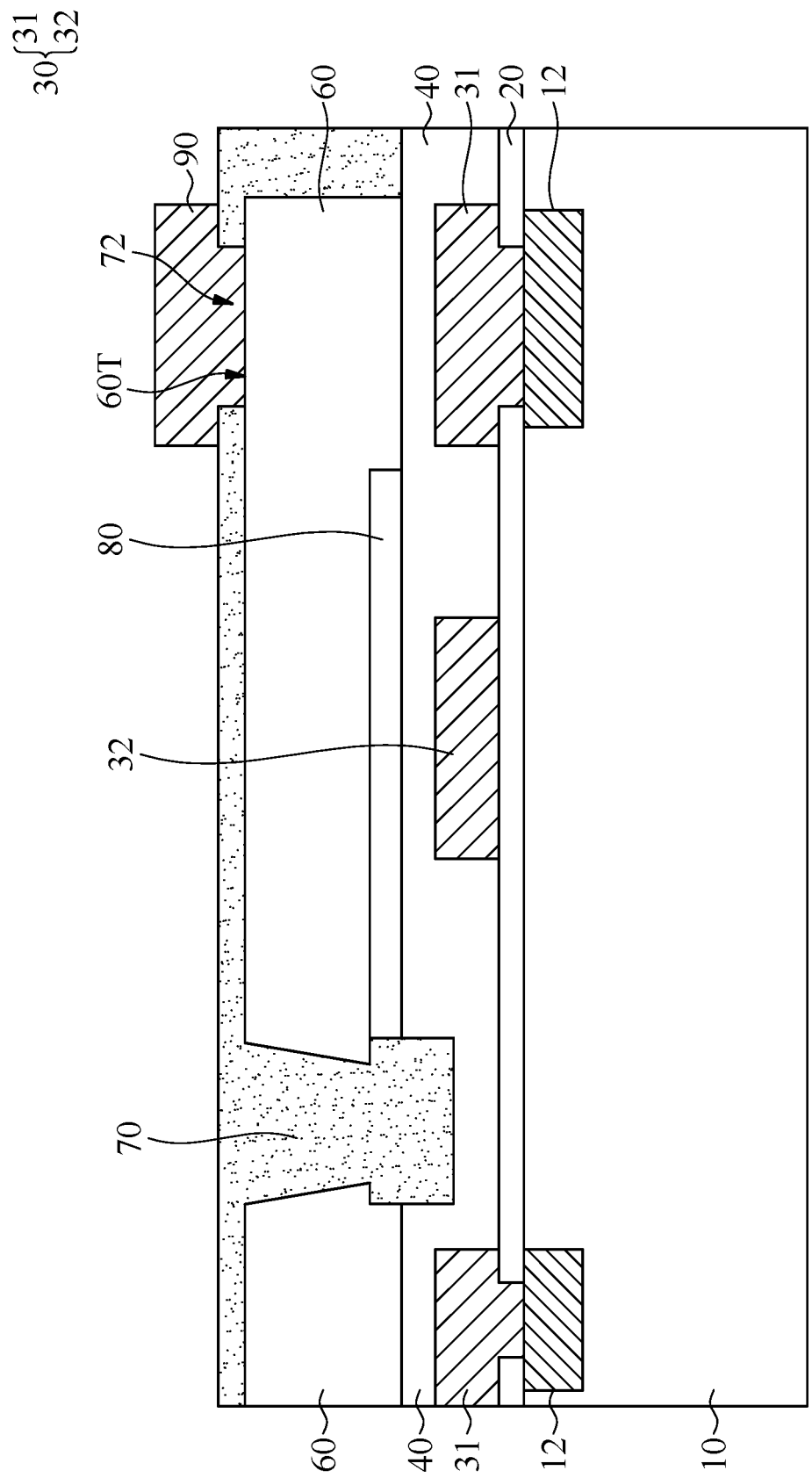
FIG. 26 is a cross-sectional view illustrating the integrated MEMS module at one stage of manufacture according to some other embodiments of the present disclosure.

Referring to FIG. 26, in some embodiments, a portion of the sealing layer 70 may be removed to form an opening 72, and the opening 72 exposes a portion of the top surface 60T of the structure layer 60. Then, a second metal layer 90 may be formed on the sealing layer 70, and the second metal layer 90 may be formed in the opening 72.

Referring to FIG. 27, in some embodiments, a third dielectric layer 92 may be formed on the sealing layer 70 and the second metal layer 90. In particular, as shown in FIG. 27, the third dielectric layer 92 may cover the sealing layer 70 and the second metal layer 90, but the present disclosure is not limited thereto.

Referring to FIG. 28, in some embodiments, a portion of the third dielectric layer 92 may be removed to form an opening 94, and the opening 94 exposes a portion of the top surface 90T of the second metal layer 90.

Then, a third metal layer 96 may be formed on the third dielectric layer 92, wherein at least a portion of the third metal layer 96 is formed in the opening 94. In particular, as shown in FIG. 28, the third metal layer 96 may include a first portion 96-1 and a second portion 96-2, wherein the first portion 96-1 is electrically connected to the second metal layer 90 (i.e., the first portion 96-1 may be disposed in the opening 94 and directly contact with the second metal layer 90), and the second portion 96-2 is electrically isolated from the second metal layer 90. Examples of the material and forming method of the third metal layer 96 may be similar to those of the first metal layer 30 or the second metal layer 90, and will not be repeated here.

Referring to FIG. 29, in some embodiments, a hygroscopic layer 98 may be formed on the second portion 96-2 of the third metal layer 96 to form the MEMS device 110. In some embodiments, the material of the hygroscopic layer 98 may include LiCl, Se, Ge, $TiO_2$, $ZnCr_2O_4$, $MgCr_2O_4$, $Al_2O_3$, epoxy or a porous metal oxide film, but the present disclosure is not limited thereto. In some embodiments, the hygroscopic layer 98 may be formed on the second portion 96-2 of the third metal layer 96 by a deposition process or a patterning process, but the present disclosure is not limited thereto.

In some embodiments, the MEMS device 110 may be, for example, a humidity sensor, but the present disclosure is not limited thereto. In some other embodiments, the MEMS device 110 may be, for example, a gas sensor. For example, the sensing material of the gas sensor may include $WO_3$, $SnO_2$, and so on, but the present disclosure is not limited thereto. The MEMS device 110 may replace at least one of the MEMS device 106 and the MEMS device 108 shown in FIG. 22, or coexist with both in the integrated MEMS module 1 shown in FIG. 22. That is, in the embodiments of the present disclosure, the integrated MEMS module 1 may integrate the MEMS devices with different sensing functions.

In summary, in some embodiments of the present disclosure, by providing the recess structure in the second dielectric layer and the opening corresponding to the recess structure in the structure layer, the sealing layer (i.e., a structure for sealing holes) may be continuously and uniformly filled into the opening and the recess structure to complete sealing. Moreover, the MEMS device and the manufacturing method thereof according to the embodiments of the present disclosure may effectively prevent the generation of sealing seams and hollow structures, thereby improving sealing quality and enhancing overall stability. Furthermore, no complicated process is required, which may effectively shorten the process time and reduce costs.

In addition, according to some embodiments of the present disclosure, at least two MEMS devices with different structures or functions may be simultaneously formed in the integrated MEMS module. Compared with the traditional MEMS module, the manufacturing method of the embodiments of the present disclosure may effectively reduce the overall size of the integrated MEMS module and simplify the process steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A manufacturing method of a MEMS device, comprising:
    providing a substrate having at least one contact;
    forming a first dielectric layer on the substrate, wherein the first dielectric layer has at least one through hole exposing a portion of a top surface of the contact;
    forming at least one first metal layer on the first dielectric layer, wherein at least a portion of the first metal layer is electrically connected to the contact;
    forming a second dielectric layer on the first dielectric layer and the first metal layer;
    forming a sacrificial layer on the second dielectric layer;
    forming a structure layer on the second dielectric layer and the sacrificial layer;
    removing a portion of the structure layer to form a first opening, wherein the first opening exposes a portion of a top surface of the sacrificial layer;
    removing a portion of the sacrificial layer through the first opening to form a second opening, wherein the second opening exposes a portion of a top surface of the second dielectric layer;
    removing a portion of the second dielectric layer through the second opening to form a recess structure, wherein a cross-sectional area at a bottom of the first opening is smaller than a cross-sectional area at a top of the recess structure;
    removing the sacrificial layer; and
    forming a sealing layer, wherein at least a portion of the sealing layer is formed in the second opening and the recess structure, and the second dielectric layer, the structure layer, and the sealing layer define a chamber.

2. The manufacturing method of the MEMS device according to claim 1, wherein the cross-sectional area at the bottom of the first opening is smaller than a cross-sectional area at a top of the first opening.

3. The manufacturing method of the MEMS device according to claim 1, further comprising:
    removing a portion of the sealing layer to form a third opening, wherein the third opening exposes a portion of a top surface of the structure layer; and
    forming a second metal layer on the sealing layer, wherein at least a portion of the second metal layer is formed in the third opening.

4. The manufacturing method of the MEMS device according to claim 3, wherein the second metal layer comprises a first portion and a second portion, the first portion directly contacts with the structure layer, and the second portion directly contacts with the sealing layer.

5. The manufacturing method of the MEMS device according to claim 3, further comprising:
    forming a third dielectric layer on the sealing layer and the second metal layer.

6. The manufacturing method of the MEMS device according to claim 5, further comprising:
    removing a portion of the third dielectric layer to form a fourth opening, wherein the fourth opening exposes a portion of a top surface of the second metal layer; and
    forming a third metal layer on the third dielectric layer, wherein at least a portion of the third metal layer is formed in the fourth opening.

7. The manufacturing method of the MEMS device according to claim 6, wherein the third metal layer comprises a first portion and a second portion, the first portion is electrically connected to the second metal layer, and the second portion is electrically isolated from the second metal layer.

8. The manufacturing method of the MEMS device according to claim 7, further comprising:
    forming a hygroscopic layer on the second portion of the third metal layer.

9. An integrated MEMS module, comprising:
    a plurality of MEMS devices, wherein each of the MEMS devices comprises:
        a substrate having at least one contact;
        a first dielectric layer disposed on the substrate;
        at least one first metal layer disposed on the first dielectric layer, and at least a portion of the first metal layer electrically connected to the contact;
        a second dielectric layer disposed on the first dielectric layer and the first metal layer and having a recess structure;
        a structure layer disposed on the second dielectric layer and having an opening, wherein the opening is disposed on and corresponds to the recess structure, and a cross-sectional area at a bottom of the opening is smaller than a cross-sectional area at a top of the recess structure;
        a sealing layer, wherein at least a portion of the sealing layer is disposed in the opening and the recess structure, wherein the second dielectric layer, the structure layer, and the sealing layer define a chamber,
    wherein the plurality of MEMS devices forms on the substrate.

10. The integrated MEMS module according to claim 9, wherein one of the MEMS devices further comprises:

a second metal layer on a portion of a top surface of the structure layer.

11. The integrated MEMS module according to claim 10, wherein the second metal layer comprises a first portion and a second portion, the first portion directly contacts with the structure layer, and the second portion directly contacts with the sealing layer.

12. The integrated MEMS module according to claim 10, wherein one of the MEMS devices further comprises:
a third dielectric layer disposed on the sealing layer and the second metal layer.

13. The integrated MEMS module according to claim 12, wherein one of the MEMS devices further comprises:
a third metal layer, wherein at least a portion of the third metal layer is disposed on a portion of a top surface of the second metal layer.

14. The integrated MEMS module according to claim 13, wherein the third metal layer comprises a first portion and a second portion, the first portion is electrically connected to the second metal layer, and the second portion is electrically isolated from the second metal layer.

15. The integrated MEMS module according to claim 13, further comprising:
a hygroscopic layer disposed on the second portion of the third metal layer.

* * * * *